(12) United States Patent
Takahashi

(10) Patent No.: US 7,750,557 B2
(45) Date of Patent: Jul. 6, 2010

(54) ORGANIC ELECTROLUMINESCENT DISPLAY DEVICE

(75) Inventor: Toshiro Takahashi, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 511 days.

(21) Appl. No.: 11/389,011

(22) Filed: Mar. 27, 2006

(65) Prior Publication Data

US 2006/0232199 A1   Oct. 19, 2006

(30) Foreign Application Priority Data

Mar. 29, 2005   (JP)   ............... 2005-095193

(51) Int. Cl.
*H01J 1/62* (2006.01)
(52) U.S. Cl. .................. 313/504; 345/100; 445/24; 445/25
(58) Field of Classification Search ......... 313/504–506; 345/100; 445/24–25
See application file for complete search history.

(56) References Cited

U.S. PATENT DOCUMENTS 6,137,220 A * 10/2000 Nagayama et al. .......... 313/504
6,680,570 B2 * 1/2004 Roitman et al. ............. 313/506
2002/0158835 A1 * 10/2002 Kobayashi et al. .......... 345/100

FOREIGN PATENT DOCUMENTS

| JP | 2001-195008 A | 7/2001 |
| JP | 2002-318556 A | 10/2002 |
| JP | 2002-352963 A | 12/2002 |
| JP | 2003-229283   | 6/2003 |
| JP | 2004-207217 A | 7/2004 |

OTHER PUBLICATIONS

Japanese Office Action issued on Jan. 26, 2010 in corresponding Application No. JP 2005-095193, and English translation thereof.

* cited by examiner

*Primary Examiner*—Nimeshkumar D Patel
*Assistant Examiner*—Mary Ellen Bowman
(74) *Attorney, Agent, or Firm*—Birch, Stewart, Kolasch & Birch, LLP

(57) ABSTRACT

An organic electroluminescent display device comprising: a substrate; a reflective layer provided on the substrate and reflecting light; an insulating layer provided on the reflective layer and transmitting light; a lower electrode provided on the insulating layer; an organic electroluminescent layer provided on the lower electrode; and an upper electrode provided on the organic electroluminescent layer and electrically connected to the reflective layer.

12 Claims, 16 Drawing Sheets

Light

Light

ORGANIC ELECTROLUMINESCENT DISPLAY DEVICE

CROSS-REFERENCE TO RELATED APPLICATION

This application claims priority under 35 USC 119 from Japanese Patent Application No. 2005-095193, the disclosure of which is incorporated by reference herein.

BACKGROUND OF THE INVENTION

1. Field of the Invention

The present invention relates to an organic electroluminescent display device.

2. Description of the Related Art

Display devices using organic electroluminescent (EL) elements have gotten much attention recently as display devices which can be made thinner and lighter than conventional CRT and LCD display devices. Being self-luminous, the organic electroluminescent elements have various advantages such as high level of visibility, no dependence on viewing angles, use of flexible film substrates, and their slimness and light weight in comparison with liquid crystal display devices.

Further, in order to reduce response time and realize high-definition display, an active matrix display device in which thin film transistors are used as switching elements for driving organic electroluminescent elements has been proposed.

FIG. 16 is a cross-sectional view showing the structure of a proposed active matrix organic electroluminescent display device. Note that FIG. 16 shows the structure of a portion of the display device corresponding to one pixel, but in practice plural pixels are arranged in the form of a matrix.

As shown in the figure, a buffer layer 102 is formed on an insulating substrate 100 formed of glass. A channel layer 104 is formed on the buffer layer 102. A gate electrode 108 is formed on the channel layer 104 via a gate insulating layer 106. A source region 110 and a drain region 112 are formed at the channel layer 104 at the sides of the gate electrode 108. In this way, a thin film transistor having the gate electrode 108, the source region 110 and the drain region 112 is formed on the buffer layer 102.

An interlayer insulating layer 114 is formed on the buffer layer 102 having the thin film transistor formed thereon. A source electrode 118 connected via a contact hole 116 to the source region 110 and a drain electrode 122 connected via a contact hole 120 to the drain region 112 are formed on the interlayer insulating layer 114.

An interlayer insulating layer 124 is formed on the interlayer insulating layer 114 on which the source electrode 118 and the drain electrode 122 are formed. A contact hole 126 which reaches the source electrode 118 is formed in the interlayer insulating layer 124.

On the interlayer insulating layer 124 having the contact hole 126 formed therein, an organic electroluminescent element having a lower electrode 128 formed by a transparent conductive layer such as an ITO (indium tin oxide) layer, an organic electroluminescent layer 130, and an upper electrode 132 formed by an Al (aluminum) layer or a Mg—Ag alloy layer is formed at a portion including the contact hole 126. The organic electroluminescent layer 130 is formed by sequentially laminating, for example, a hole transport layer, a luminescent layer and an electron transport layer. The lower electrode 128 is electrically connected to the source electrode 118 via the contact hole 126 formed in the interlayer insulating layer 124.

In the proposed organic electroluminescent display device shown in FIG. 16, a layer which does not transmit light such as the Al layer is used as the upper electrode 132. Thus, in the organic electroluminescent display device shown in FIG. 16, light generated at the luminescent layer of the organic electroluminescent layer 130 exits from the side of the insulating substrate 100. The organic electroluminescent display device having such a structure is called a bottom emission organic electroluminescent display device.

In order to realize full-color display at the organic electroluminescent display device shown in FIG. 16, luminescent layers having different emission wavelengths need to be formed at a pixel area. For example, a mask having an opening at a portion corresponding to the pixel area is made to closely contact the substrate. Luminescent layers forming the respective colors of R, G and B are formed by moving the masks in the order of, for example, R, G and B.

In the case of the bottom emission organic electroluminescent display device, as described above, light generated at the organic electroluminescent element exits from the insulating substrate side. In the organic electroluminescent display device shown in FIG. 16, since the switching element is formed between the insulating substrate and the organic electroluminescent element, an emission area for a pixel is practically decreased due to the existence of the switching element. As a result, high brightness cannot be achieved.

In order to improve brightness, it has also been proposed to make light, which is generated at the luminescent layer, exit from the side of the upper electrode. The organic electroluminescent display device having such a structure is called a top emission organic electroluminescent display device.

FIG. 17 is a cross-sectional view showing the structure of a proposed top emission organic electroluminescent display device.

As shown in the figure, an upper electrode 134 which transmits light and is formed by a transparent conductive layer such as an ITO layer is used as the upper electrode of the organic electroluminescent element. With this structure, light generated at the luminescent layer of the organic electroluminescent layer 130 exits from the side of the upper electrode 134. In the top emission organic electroluminescent display device, light generated at the organic electroluminescent element is not prevented by the thin film transistor from exiting. Thus, according to the proposed organic electroluminescent display device shown in FIG. 17, the aperture ratio of a pixel can be improved. In FIG. 17, the reference characters other than the above have the same meanings as in FIG. 16.

However, the upper electrode for the top emission organic electroluminescent display device needs to be thin in order to ensure light transmission. Further, the transparent conductive layer such as the ITO layer used as the upper electrode has a resistance larger than that of a metal layer or the like. For this reason, the resistance of the upper electrode may increase to cause voltage drop, thereby resulting in deterioration of display performance such as degradation of brightness or uneven brightness.

As a countermeasure for suppressing voltage drop at the upper electrode, it has been proposed to connect an auxiliary wiring formed of metal to the upper electrode (see, for example, Japanese Patent Application Laid-Open Nos. 2001-195008, 2004-207217, 2002-318556 and 2002-352963).

For example, Japanese Patent Application Laid-Open No. 2001-195008 discloses an organic electroluminescent display device in which a rib serving as a spacer for a mask and also as an auxiliary wiring for a common upper electrode is provided for each pixel.

Further, Japanese Patent Application Laid-Open No. 2004-207217 discloses an organic electroluminescent display device in which an upper electrode is connected via a connection hole to an auxiliary wiring, which is formed in the same layer as a lower electrode and disposed such that the auxiliary wiring is insulated from the lower electrode.

In the technique disclosed in Japanese Patent Application Laid-Open No. 2001-195008, however, the size of a pixel is decreased by the rib serving as the auxiliary wiring. Thus, it is difficult to achieve sufficiently high brightness.

In the technique disclosed in Japanese Patent Application Laid-Open No. 2004-207217 as well, the size of a pixel is decreased by the auxiliary wiring. Thus, it is difficult to achieve sufficiently high brightness.

SUMMARY OF THE INVENTION

The present invention has been made in consideration of the situation described above, and provides an organic electroluminescent display device.

A first aspect of the present invention provides an organic electroluminescent display device comprising: a substrate; a reflective layer provided on the substrate and reflecting light; an insulating layer provided on the reflective layer and transmitting light; a lower electrode provided on the insulating layer; an organic electroluminescent layer provided on the lower electrode; and an upper electrode provided on the organic electroluminescent layer and electrically connected to the reflective layer.

DETAILED DESCRIPTION OF THE INVENTION

First Embodiment

Figure 1A:
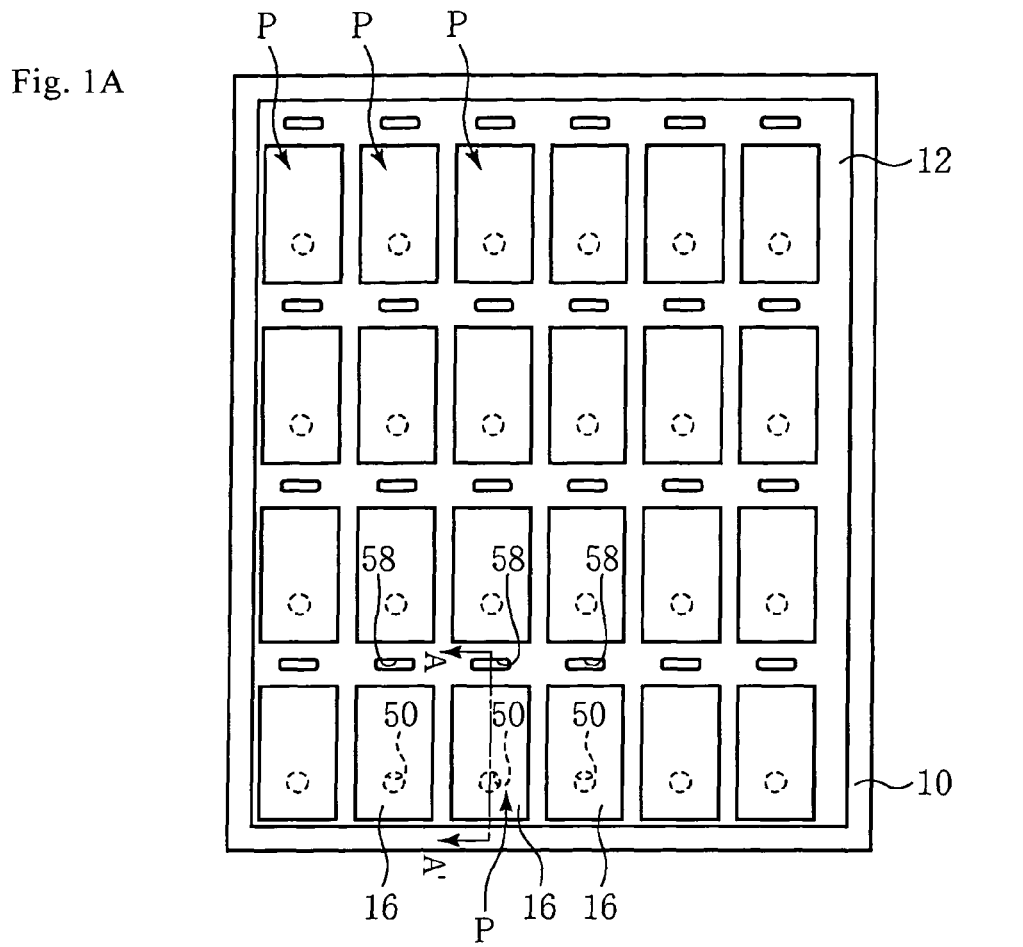
FIGS. 1A and 1B are schematic diagrams showing the structure of an organic electroluminescent display device according to a first embodiment of the present invention.
Figure 1B:
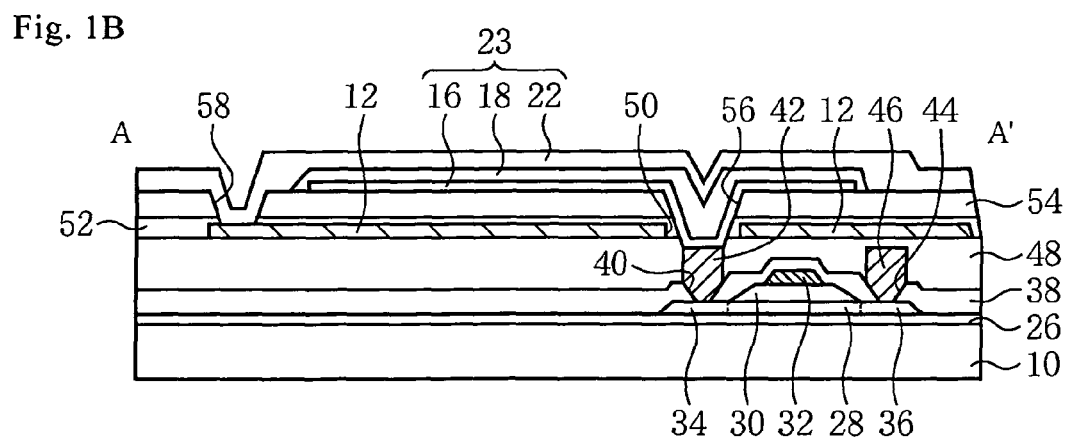

An organic electroluminescent display device and a process for manufacturing the same according to a first embodiment of the present invention will be described with reference to FIGS. 1A to 6B. FIGS. 1A and 1B are schematic diagrams showing the structure of an organic electroluminescent display device according to the present first embodiment, and FIGS. 2A to 6B are cross-sectional views showing the process for manufacturing the organic electroluminescent display device.

First, the structure of the organic electroluminescent display device according to the present first embodiment will be described with reference to FIGS. 1A and 1B. FIG. 1A is a plane view showing the structure of the organic electroluminescent display device according to the present first embodiment, and FIG. 1B is an enlarged cross-sectional view thereof along line A-A'.

As shown in FIG. 1A, the organic electroluminescent display device according to the present first embodiment is an active matrix organic electroluminescent display device including an insulating substrate 10 and thin film transistors disposed thereon as switching elements for driving organic electroluminescent elements.

As shown in FIG. 1B, a buffer layer 26 made of silicon dioxide is formed on the insulating substrate 10 such as a glass substrate. A channel layer 28 made of polysilicon is formed on the buffer layer 26. A gate electrode 32 is formed on the channel layer 28 via a gate insulating layer 30 made of silicon dioxide. A source region 34 and a drain region 36 are formed at the sides of the gate electrode 32. In this way, the thin film transistor having the gate electrode 32, the source region 34 and the drain region 36 is formed on the buffer layer 26.

An interlayer insulating layer 38 made of silicon nitride is formed on the buffer layer 26 on which the thin film transistor is formed. A source electrode 42 connected via a contact hole 40 to the source region 34, and a drain electrode 46 connected via a contact hole 44 to the drain region 36 are formed on the interlayer insulating layer 38.

An interlayer insulating layer 48 such as a silicon dioxide layer is formed on the interlayer insulating layer 38 on which the source electrode 42 and the drain electrode 46 are formed. The interlayer insulating layer 48 is not limited to the silicon dioxide layer, and an inorganic insulating layer such as a silicon nitride layer or an insulating layer made of resin may be used as the interlayer insulating layer 48.

A reflective layer 12 which reflects light and has good conductivity is formed on the interlayer insulating layer 48. As shown in FIG. 1A, the reflective layer 12 is formed over the entire surface of a display area in which plural pixels P are arranged. Alternatively, the reflective layer 12 of a predetermined shape may be formed for each pixel P. A region above the thin film transistor is covered with the reflective layer 12. An opening 50 is formed in the reflective layer 12 at a portion thereof above the source electrode 42. An Al layer, for example, is used as the reflective layer 12. The light reflectance of the reflective layer 12 is, for example, 50% or more, and preferably 80% or more. The interlayer insulating layer 48 having such a high light transmission is formed so as to achieve high brightness. As will be described later, the reflective layer 12 is electrically connected to an upper electrode 22 and also serves as an auxiliary electrode which decreases the resistance of the upper electrode 22. A material having a resistance lower than that of a material for the upper electrode 22 (which will be described later) is used for the reflective layer 12. The reason is, as will be described later, to decrease the resistance of the upper electrode 22. Alternatively, a material of a resistance equal to that of the material for the upper electrode 22 may be used for the reflective layer 12. The resistance of the upper electrode 22 can be decreased in this case as well.

An interlayer insulating layer 52 such as a silicon nitride layer is formed on the interlayer insulating layer 48 on which the reflective layer 12 is formed. The interlayer insulating layer 52 transmits light at a light transmittance of 50% or more, and preferably 80% or more. The interlayer insulating layer 52 having such a high light transmittance is formed to achieve high brightness. An interlayer insulating layer 54 which also transmits light is formed on the interlayer insulating layer 52. Photosensitive resin such as acrylic resin is used as a material for the interlayer insulating layer 54. The light transmittance of the interlayer insulating layer 54 is, for example, 50% or more, and preferably 80% or more. The interlayer insulating layer 54 having such a high light transmittance is formed so as to achieve high brightness. The total thickness of the interlayer insulating layers 52 and 54 is, for example, 1 μm or more. The total thickness of these interlayer insulating layers 52 and 54 is set to be relatively large so that light is prevented from decreasing at the interlayer insulating layers 52 and 54 due to interference of light.

A contact hole 56 is formed in the interlayer insulating layers 54, 52 and 48 at portions thereof above the source electrode 42 so as to reach the source electrode 42 via the opening 50 formed in the reflective layer 12. A contact hole 58 which reaches the reflective layer 12 is formed in the interlayer insulating layers 54 and 52.

A lower electrode 16 is formed on the interlayer insulating layer 54 at a portion thereof including the contact hole 56. The lower electrode 16 is electrically connected to the source electrode 42 via the contact hole 56 formed in the interlayer insulating layers 48, 52 and 54. As shown in FIG. 1A, the lower electrode 16 is formed in the shape of a rectangle for each pixel P. A transparent conductive layer made of ITO, for example, is used as the lower electrode 16. The lower electrode 16 serves as an anode.

An organic electroluminescent layer 18 in which a hole injection layer, a hole transport layer and a luminescent layer are sequentially laminated is formed on the lower electrode 16. The organic electroluminescent layer 18 is formed in the shape of a rectangle which is wider than the lower electrode 16 so as to cover the rectangular lower electrode 16. A 2-TNATA (4,4',4"-tris(2-naphthylphenylamino)triphenylamine) layer, for example, is used as the hole injection layer. An α-NPD (N,N'-dinaphthyl-N,N'-diphenyl-[1,1'-biphenyl]-4,4'-diamine) layer, for example, is used as the hole transport layer. An Alq$_3$ (tris(8-hydroxyquinolinate)aluminum) layer, for example, is used as the luminescent layer.

The upper electrode 22 which transmits light is formed on the interlayer insulating layer 54 and organic electroluminescent layer 18 having the contact hole 58 formed therein. The upper electrode 22 is formed as a common electrode over the entire surface of the display area in which the plural pixels P are arranged. The upper electrode 22 is electrically connected to the reflective layer 12 via the contact hole 58. As described above, the reflective layer 12 is formed of a material having a resistance lower than that of the upper electrode 22. For example, a laminated layer formed by sequentially laminating an Al layer, which has a thickness of 30 nm or less and transmits light, and a transparent conductive layer made of ITO can be used as the upper electrode 22. The light transmittance of the upper electrode 22 is, for example, 50% or more, and preferably 80% or more. The upper electrode 22 having such a high light transmittance is formed so as to achieve high brightness. The upper electrode 22 serves as a cathode.

In this way, an organic electroluminescent element 23 having the lower electrode 16, the organic electroluminescent layer 18 and the upper electrode 22 is formed on the interlayer insulating layer 54.

The above organic electroluminescent element 23 is formed at each region at which the lower electrode 16 and the upper electrode 22 overlap each other, and, as shown in FIG. 1A, the pixel P is formed at each region at which the rectangular lower electrode 16 is formed. For each pixel P, the contact hole 58 is formed and the upper electrode 22 is electrically connected via the contact hole 58 to the reflective layer 12.

In this way, the organic electroluminescent display device according to the present first embodiment is formed.

In the organic electroluminescent display device of the present first embodiment, an electron is injected from the upper electrode 22 into the organic electroluminescent layer 18, and a hole is injected from the lower electrode 16 into the organic electroluminescent layer 18. The electron is injected from the upper electrode 22 directly into the luminescent layer, and the hole injected is transported to the luminescent layer by the hole transport layer. Light is generated when the electron and hole thus transported recombine at the luminescent layer. The light generated at the luminescent layer is emitted towards the upper electrode 22 and the lower electrode 16. The light emitted towards the light-transmitting upper electrode 22 directly exits therefrom. The light emitted towards the lower electrode 16 proceeds via the lower electrode 16, which is formed by a transparent conductive layer, and the light-transmitting interlayer insulating layers 52 and 54, but is reflected by the reflective layer 12 towards the light-transmitting upper electrode 22, and exits therefrom.

As described above, the organic electroluminescent display device of the present first embodiment has a top emission structure in which light exits from the upper electrode 22 side.

One of the main characteristics of the organic electroluminescent display device according to the present first embodiment is that the reflective layer 12 which reflects light is formed below the lower electrode 16 formed by a transparent conductive layer, with the interlayer insulating layers 52 and 54 which transmit light being interposed therebetween.

In the organic electroluminescent display device according to the present first embodiment, since the reflective layer 12 is formed below the lower electrode 16, light emitted from the organic electroluminescent layer 18 towards the lower electrode 16 can be reflected by the reflective layer 12 towards the upper electrode 22. Thus, according to the present first embodiment, a top emission organic electroluminescent display device of high brightness can be formed.

Figure 16:
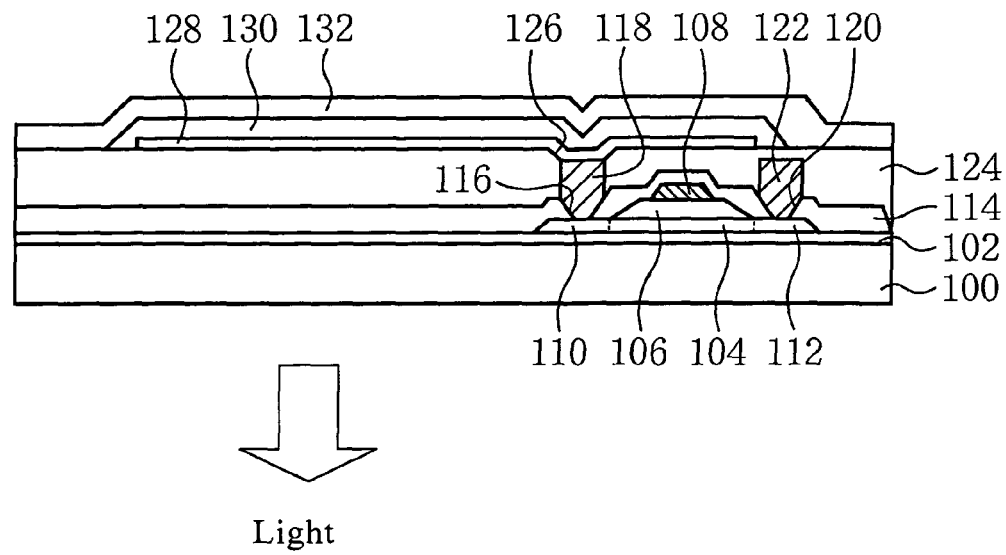
FIG. 16 is a cross-sectional view showing the structure of a bottom emission organic electroluminescent display device.
Figure 17:
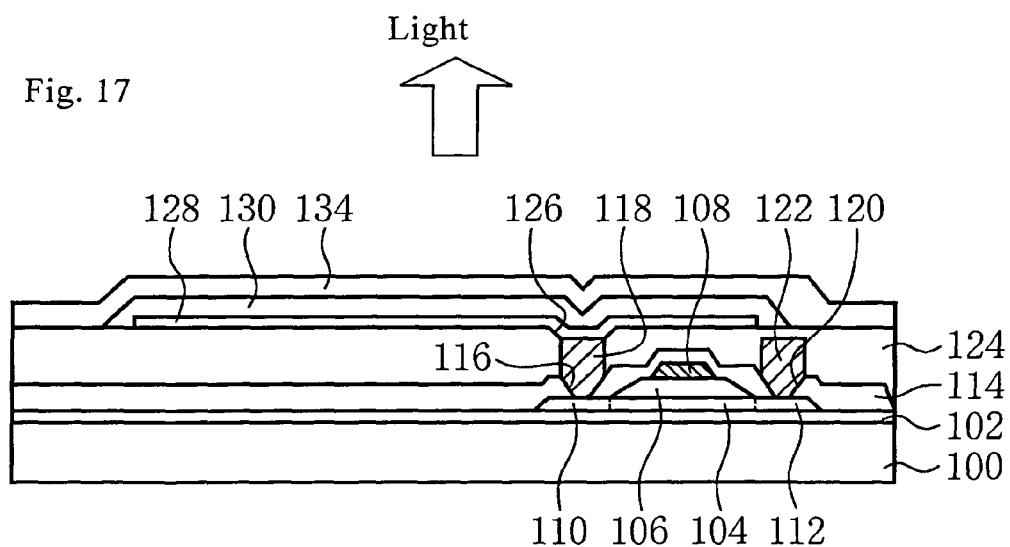
FIG. 17 is a cross-sectional view showing the structure of a top emission organic electroluminescent display device.

Further, according to the present embodiment, the transparent conductive layer of ITO is used as the lower electrode 16. Accordingly, the structure of the organic electroluminescent layer of the bottom emission organic electroluminescent display device such as one shown in FIG. 16 can be used for the organic electroluminescent layer 18 to form a top emission organic electroluminescent display device of high brightness.

Furthermore, another main characteristic of the organic electroluminescent display device according to the present first embodiment is that the upper electrode 22 is electrically connected to the reflective layer 12.

In the top emission organic electroluminescent display device, the upper electrode needs to have high light-transmission characteristics since light is made to exit from the upper electrode side. In order to realize high light-transmission characteristics, the upper electrode needs to be made thin. However, if the upper electrode is simply made thin, the resistance of the upper electrode increases, thereby causing voltage drop at the upper electrode. Consequently, display properties of the organic electroluminescent display device deteriorate, such as degradation of brightness or uneven brightness.

In contrast, in the organic electroluminescent display device according to the present first embodiment, the reflective layer 12 having good conductivity is electrically connected to the upper electrode 22. According to the present first embodiment, since the reflective layer serves as the auxiliary electrode, the resistance of the upper electrode 22 can be decreased and voltage drop thereof can be suppressed even if the upper electrode 22 is thin. Thus, according to the present first embodiment, the organic electroluminescent display device having good display properties can be provided.

Moreover, the reflective layer 12 serving as the auxiliary electrode which decreases the resistance of the upper electrode 22 is formed below the lower electrode 16 separately therefrom. Thus, the thickness, shape and the like of the reflective layer 12 can be determined at a relatively high degree of freedom, and the resistance of the reflective layer 12 can be set to a desired value. Consequently, decreasing the resistance of the upper electrode 22 can be reliably realized.

Further, as in the organic electroluminescent display devices disclosed in Japanese Patent Application Laid-Open Nos. 2001-195008 and 2004-207217, when the auxiliary electrode for decreasing the resistance of the upper electrode is formed in the same layer as or above the lower electrode, the aperture ratio is decreased owing to the presence of the auxiliary electrode.

In contrast, according to the organic electroluminescent display device of the present first embodiment, the auxiliary electrode for decreasing the resistance of the upper electrode 22 is formed by the reflective layer 12 which is formed below the lower electrode 16. Thus, the resistance of the upper electrode 22 can be decreased without decreasing the aperture ratio of the pixel.

Moreover, since an upper portion of the thin film transistor is covered with the reflective layer 12, the influence of light emission by the organic luminescent element 23 on the characteristics of the thin film transistor can be suppressed. In the case in which the reflective layer 12 of a predetermined shape is formed for each pixel P as well, the reflective layer 12 which is wider than the lower electrode 16 is formed below the lower electrode 16, such that the reflective layer 12 covers the upper portion of the thin film transistor. In this way, the influence of light emission by the organic luminescent element 23 on the characteristics of the thin film transistor can be suppressed.

Next, the process for manufacturing the organic electroluminescent display device according to the present first embodiment will be described with reference to FIGS. 2A to 6B.

First, the buffer layer 26 formed by, for example, a silicon dioxide layer having a thickness of 300 nm, is formed on the insulating substrate 10 such as a glass substrate by, for example, a CVD method.

Then, for example, a polysilicon layer having a thickness of 50 nm is formed on the buffer layer 26 by the CVD method, for example. Instead of the polysilicon layer, an amorphous silicon layer may be formed and crystallized by laser annealing or the like to thereby form a polysilicon layer.

Figure 2A:
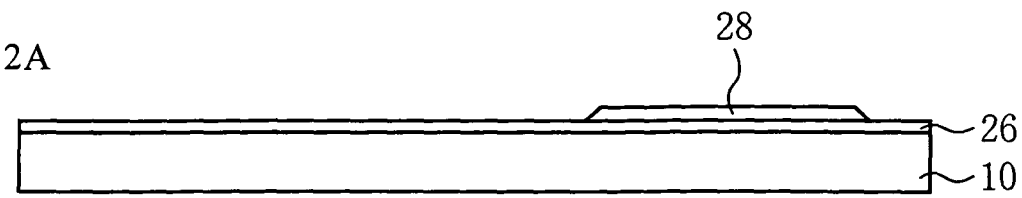
FIGS. 2A to 6B are cross-sectional views showing a process for manufacturing the organic electroluminescent display device according to the first embodiment of the present invention.

Subsequently, the polysilicon layer is patterned by photolithography and dry etching, thereby forming the channel layer 28 (see FIG. 2A).

Thereafter, for example, a silicon dioxide layer having a thickness of 100 nm is formed by the CVD method, for example, on the buffer layer 26 having the channel layer 28 formed thereon.

Then, for example, an AlNd (aluminum-neodymium alloy) layer having a thickness of 200 nm is formed by sputtering, for example.

Subsequently, the silicon dioxide layer and the AlNd layer are subjected to patterning by photolithography and dry etching to form on the channel layer 28 the gate insulating layer 30 made of silicon dioxide and the gate electrode 32 made of AlNd, respectively.

Figure 2B:
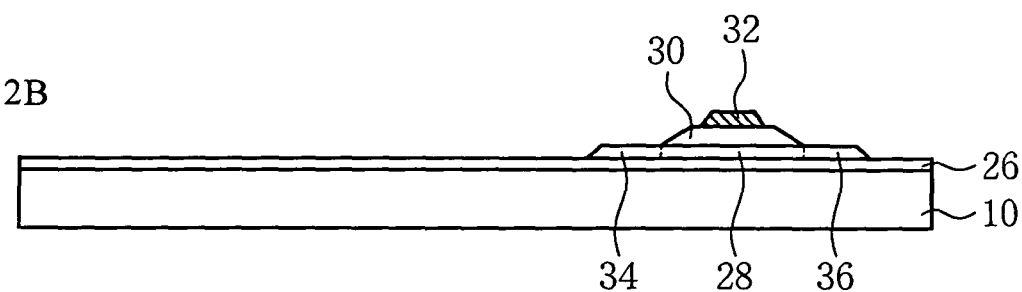

Then, phosphor ion, for example, is implanted by ion implantation, for example, with the gate electrode 32 being a mask to form the source region 34 and the drain region 36 at the channel layer 28 at the sides of the gate electrode 32 (see FIG. 2B).

In this way, the thin film transistor having the gate electrode 32, the source region 34 and the drain region 36 is formed on the buffer layer 26.

Next, the interlayer insulating layer 38 which is, for example, a silicon nitride layer having a thickness of, for example, 450 nm is formed by the CVD method on the buffer layer 26 having the thin film transistor formed thereon.

Figure 2C:
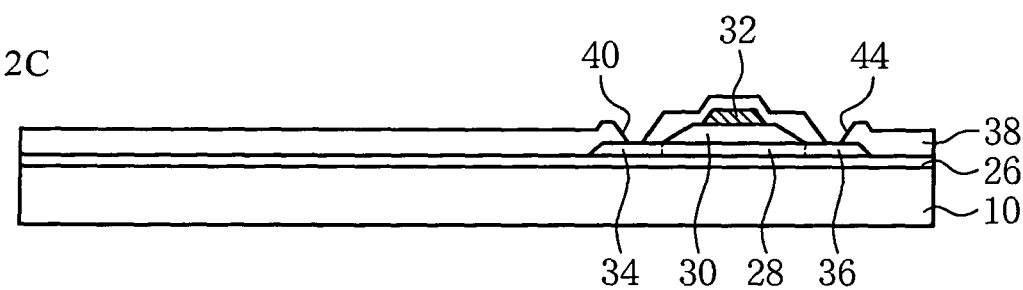

Then, the contact hole 40 reaching the source region 34 and the contact hole 44 reaching the drain region 36 are formed in the interlayer insulating layer 38 by photolithography and dry etching (see FIG. 2C).

Subsequently, for example, a Ti/Al/Ti layer formed by sequentially laminating a titanium (Ti) layer having a thickness of 150 nm, an Al layer having a thickness of 150 nm and another Ti layer having a thickness of 150 nm is formed by, for example, sputtering on the interlayer insulating layer 38 in which the contact holes 40 and 44 are formed.

Figure 3A:
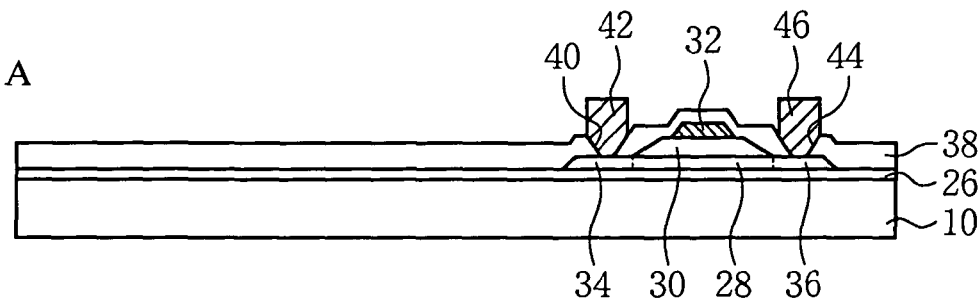

Then, the Ti/Al/Ti layer is subjected to patterning by photolithography and dry etching to form the source electrode 42 and the drain electrode 46 (see FIG. 3A).

Thereafter, the interlayer insulating layer 48 formed by, for example, a silicon dioxide layer having a thickness of 400 nm is formed by the CVD method, for example, on the interlayer insulating layer 38 on which the source electrode 42 and the drain electrode 46 are formed.

Figure 3B:
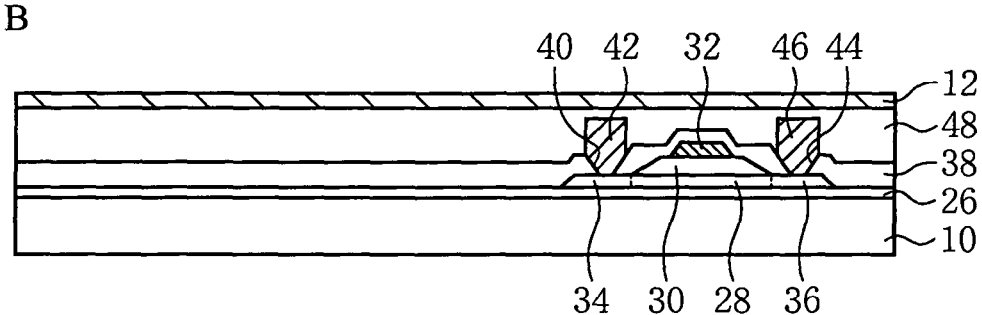
Figure 3C:
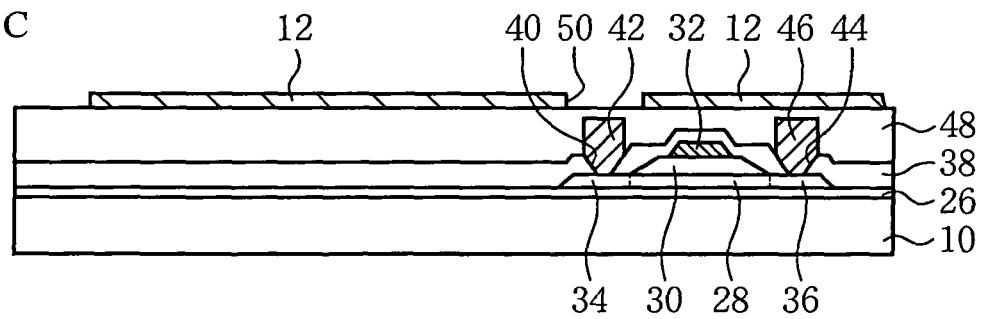

Subsequently, for example, an Al layer 12 having a thickness of 200 nm is formed on the interlayer insulating layer 48 by sputtering, for example (see FIG. 3B).

Then, the Al layer 12 is subjected to patterning by photolithography and dry etching to be given a predetermined shape. At the time of the patterning, the Al layer 12 is made to remain over the entire surface of the display area, and the opening 50 which exposes the interlayer insulating layer 48 at a portion thereof above the source electrode 42 is formed in the Al layer 12. In this way, the reflective layer 12 of Al is formed on the interlayer insulating layer 48 (see FIG. 3C).

Next, the interlayer insulating layer 52 which is, for example, a silicon nitride layer having a thickness of 200 nm is formed by the CVD method, for example, on the interlayer insulating layer 48 having the reflective layer 12 formed thereon.

Subsequently, photosensitive resin which transmits light is applied onto the interlayer insulating layer 52 by spin coating, for example. Acrylic resin, for example, is used as the photosensitive resin. In this way, the interlayer insulating layer 54 made of light-transmitting photosensitive resin is formed on the interlayer insulating layer 52 (see FIG. 4A). The total thickness of the interlayer insulating layers 54 and 52 formed between the lower electrode 16 and the reflective layer 12 is preferably set to be 1 μm or more. Setting the total thickness of the interlayer insulating layers 52 and 54 to be relatively large such as 1 μm or more prevents light from decreasing at the interlayer insulating layers 52 and 54 due to interference of light.

Figure 4A:
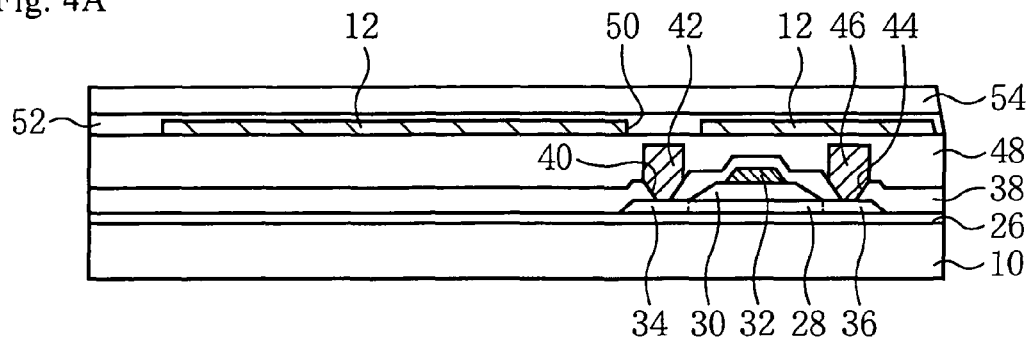
Figure 4B:
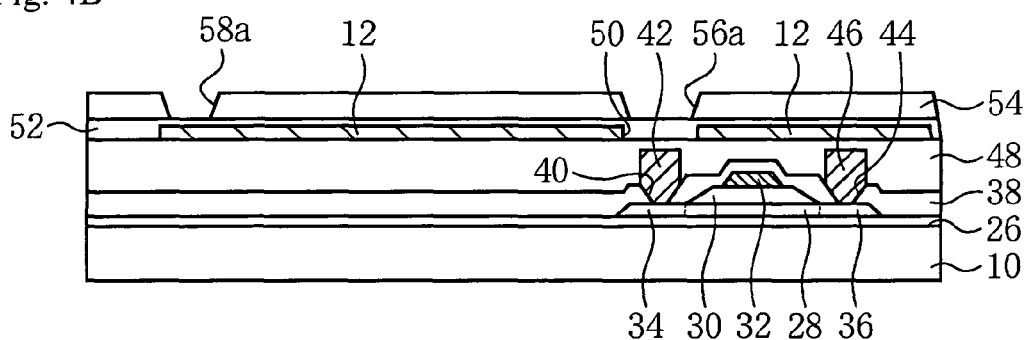
Figure 4C:
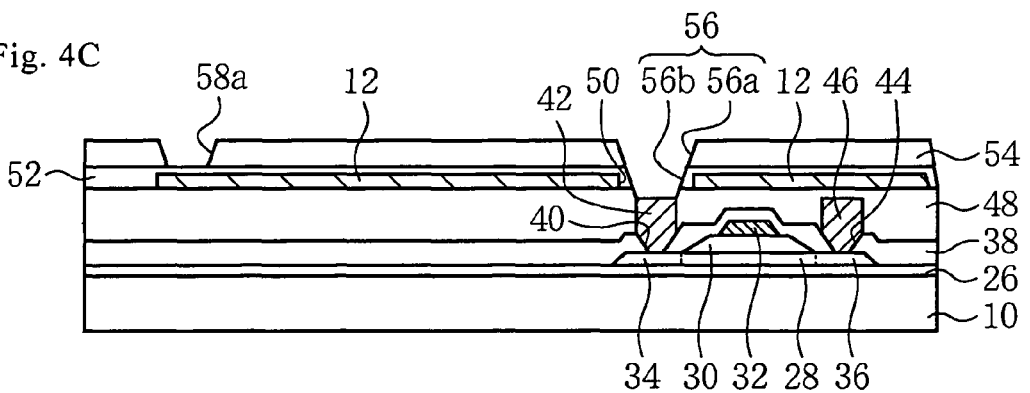

Thereafter, an opening 56a reaching the interlayer insulating layer 52 at a portion above the source electrode, and an opening 58a reaching the interlayer insulating layer 52 at a portion above the reflective layer 12 are formed in the interlayer insulating layer 54 by photolithography (see FIG. 4B).

Then, an opening 56b reaching the source electrode 42 is formed by dry etching in the interlayer insulating layer 48 and the interlayer insulating layer 52 exposed to the opening 56a of the interlayer insulating layer 54. In this way, the contact hole 56 which is formed by the openings 56a and 56b and reaches the source electrode 42 is formed (see FIG. 4C).

Figure 5A:
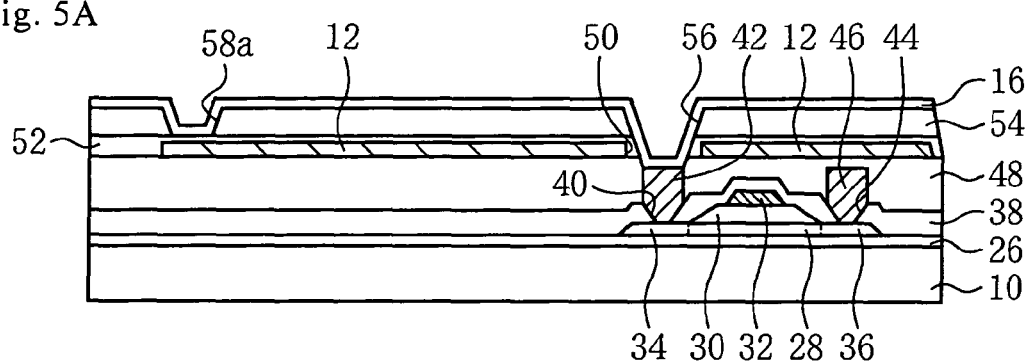
Figure 5B:
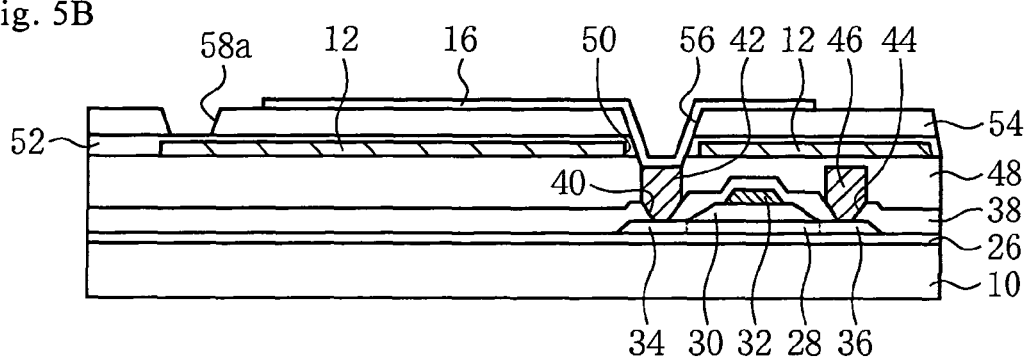
Figure 5C:
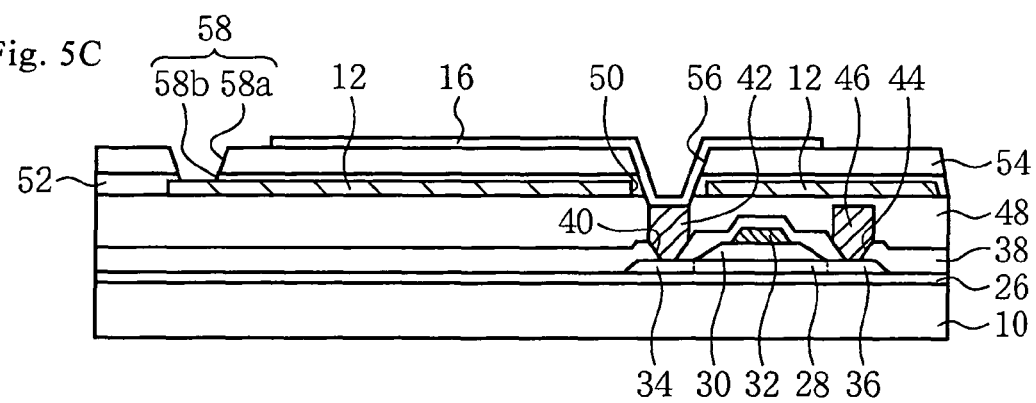
Figure 6A:
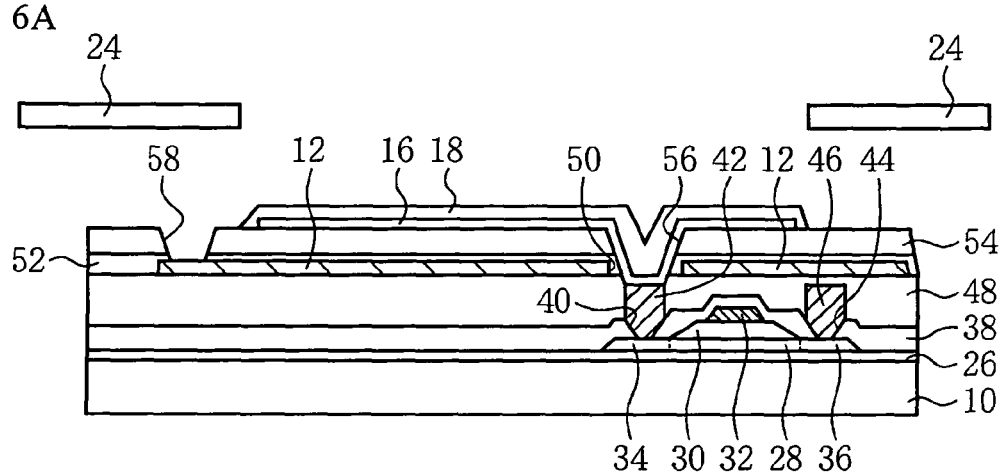
Figure 6B:
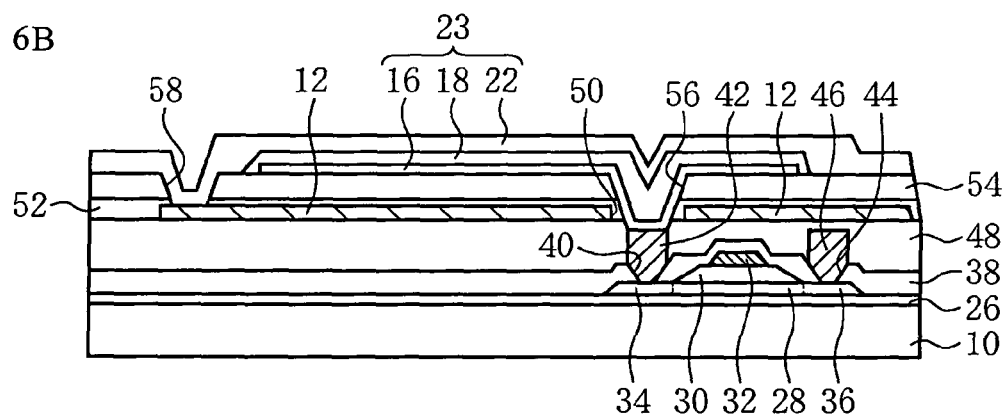

Thereafter, a transparent conductive layer 16 which is, for example, an ITO layer having a thickness of 100 nm is formed by sputtering, for example, on the interlaying insulating layer 54 having the contact hole 56 formed therein (see FIG. 5A).

Subsequently, the transparent conductive layer 16 is subjected to patterning by photolithography and etching to be formed in the shape of a rectangle for each pixel P. In this way, the lower electrode 16 which is rectangular and formed by the transparent conductive layer is formed on the interlayer insulating layer 54 (see FIG. 5B). The lower electrode 16 is electrically connected to the source electrode 42 via the contact hole 56. The shape of the lower electrode 16 is not limited to a rectangle, and various shapes may be used for the lower electrode 16.

Then, an opening 58b reaching the reflective layer 12 is formed by dry etching in the interlayer insulating layer 52 which is exposed to the opening 58a formed in the interlayer insulating layer 54. In this way, the contact hole 58 which is formed by the openings 58a and 58b and reaches the reflective layer 12 is formed (see FIG. 5C).

Thereafter, for example, a 2-TNATA layer having a thickness of 20 nm, an α-NPD layer having a thickness of 20 nm and an Alq$_3$ layer having a thickness of 50 nm are sequentially formed on the lower electrode 16 by a vacuum evaporation method via an evaporation mask 24 which has an opening of a predetermined size. In this way, the organic electroluminescent layer 18 having the 2-TNATA hole injection layer, the α-NPD hole transport layer and the Alq$_3$ luminescent layer is formed on the lower electrode 16 (see FIG. 6A). The organic electroluminescent layer 18 is formed in the shape of a rectangle which is wider than the lower electrode 16 so as to cover the rectangular lower electrode 16. The shape of the organic electroluminescent layer 18 is not limited to a rectangle, and various shapes can be used according to the shape or the like of the lower electrode 16.

Subsequently, on the interlayer insulating layer 54 on which the organic electroluminescent layer 18 is formed, for example, an Al layer which transmits light and has a thickness of 10 nm, and a transparent conductive layer which is, for example, an ITO layer having a thickness of 30 nm, are sequentially formed by the vacuum evaporation method or sputtering, for example, via a mask which has an opening of a predetermined shape. In this way, the upper electrode 22 electrically connected to the reflective layer 12 via the contact hole 58 is formed over the entire surface of the display area in which the plural pixels P are arranged (see FIG. 6B). In this way, the organic electroluminescent device 23, having the lower electrode 16, the organic electroluminescent layer 18, and the upper electrode 22, is formed.

The organic electroluminescent display device according to the present first embodiment shown in FIGS. 1A and 1B is manufactured as described above.

As described above, according to the present first embodiment, the reflective layer 12 is formed below the lower electrode 16, and the upper electrode 22 is electrically connected to the reflective layer 12 via the contact hole 58. Thus, the resistance of the upper electrode 22 can be decreased while decrease in the aperture ratio of the pixel is avoided, whereby voltage drop of the upper electrode 22 can be suppressed. As a result, the top emission organic electroluminescent display device of good display properties and high brightness can be provided.

In the above description, the reflective layer 12 is formed over the entire surface of the display area in which the plural pixels P are arranged. However, the reflective layer 12 may be formed in the shape of stripes as in an organic electroluminescent display device according to the following modified example. By forming the reflective layer 12 in the shape of stripes, parasitic capacity formed between the reflective layer 12 and another conductive layer can be reduced as compared with the case in which the reflective layer 12 is formed over the entire surface of the display area.

FIRST MODIFIED EXAMPLE

Figure 7:
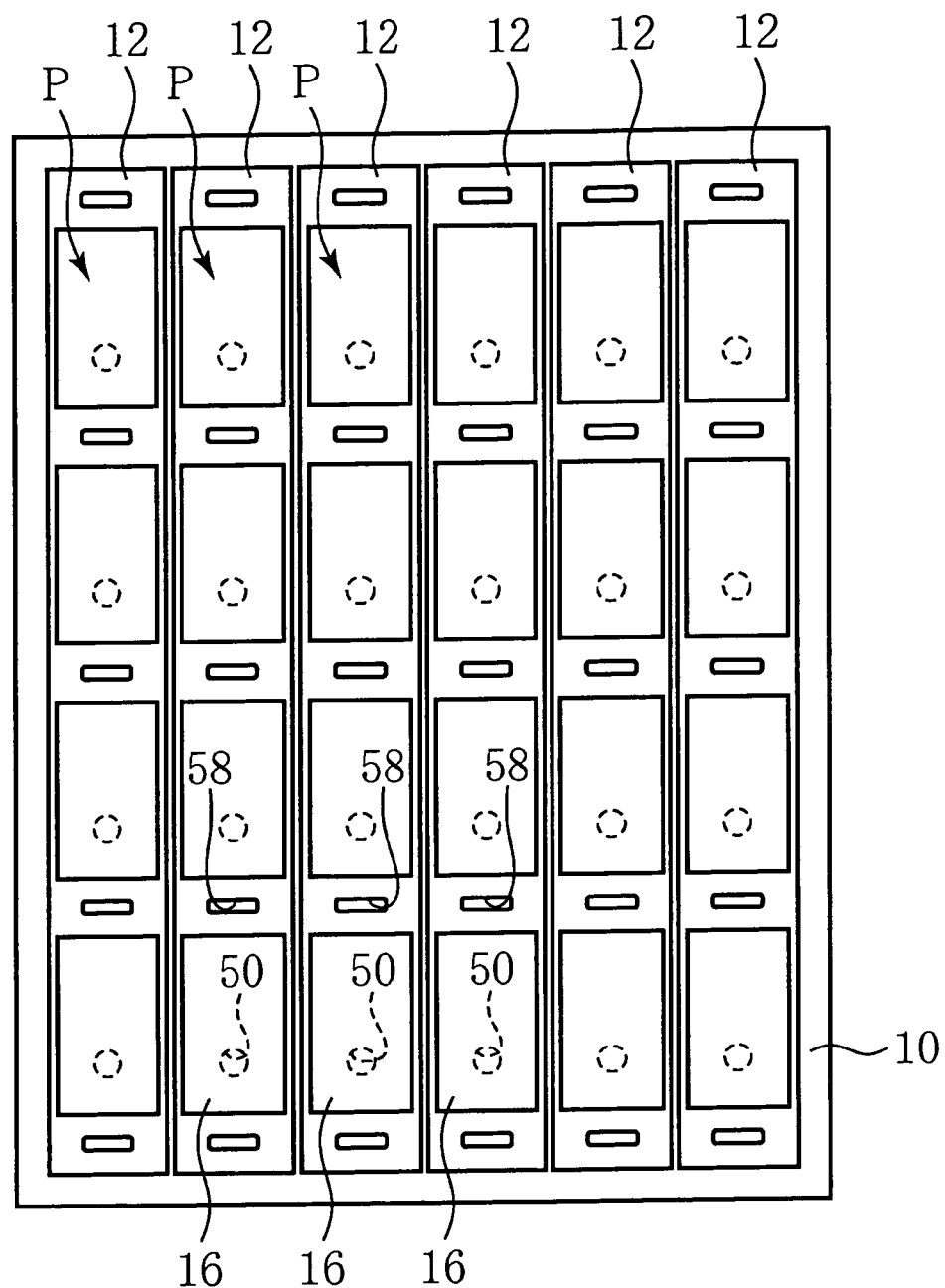
FIG. 7 is a plane view showing the structure of an organic electroluminescent display device according to a first modified example of the first embodiment of the present invention.

The organic electroluminescent display device according to a first modified example of the present first embodiment will be described with reference to FIG. 7. FIG. 7 is a plane view showing the structure of the organic electroluminescent display device according to the present first modified example.

As shown in FIG. 7, the reflective layer 12 is formed in the shape of stripes each of which extends along an array of the rectangular lower electrodes 16 arranged in a longitudinal direction of the figure. Each stripe of the reflective layer 12 is wider than the lower electrode 16. For this reason, light generated at the luminescent layer of the organic electroluminescent layer 18 can be reliably reflected towards the upper electrode 22 side. Further, the influence of light emission by the organic electroluminescent elements on the characteristics of the thin film transistor can be suppressed. At each pixel P, the upper electrode 22 is electrically connected to the stripe-shaped reflective layer 12 via the contact hole 58.

According to the present first modified example, the reflective layer 12 is formed in the shape of stripes. Accordingly, as described above, parasitic capacity formed between the reflective layer 12 and another conductive layer can be reduced as compared with the case in which the reflective layer 12 is formed over the entire surface of the display area.

SECOND MODIFIED EXAMPLE

Figure 8:
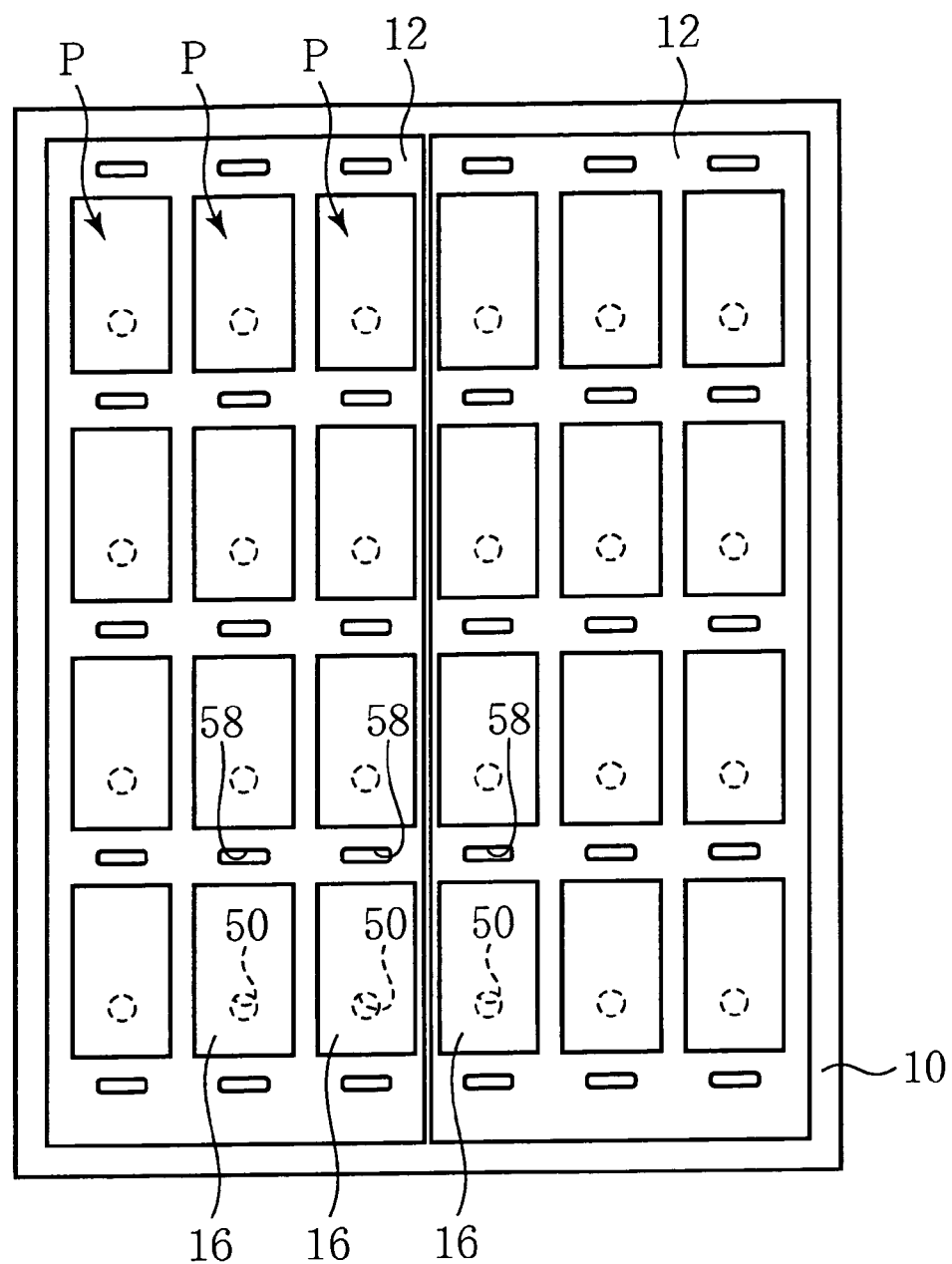
FIG. 8 is a plane view showing the structure of an organic electroluminescent display device according to a second modified example of the first embodiment of the present invention.

An organic electroluminescent display device according to a second modified example of the present first embodiment will be described with reference to FIG. 8. FIG. 8 is a plane view showing the structure of the organic electroluminescent display device according to the present second modified example.

As shown in FIG. 8, the reflective layer 12 is formed in the shape of stripes each of which extends along plural arrays of the rectangular lower electrodes 16 arranged in a longitudinal direction of the figure. Each stripe of the reflective layer 12 is wider than the total width of the plural arrays of the lower electrodes 16. FIG. 8 shows a case in which each of the stripes of the reflective layer 12 extends along three arrays of the lower electrodes 16 arranged in the longitudinal direction of the figure. Since the stripe of the reflective layer 12 is wider than the width of the arrays of the lower electrodes 16, light generated at the luminescent layer of the organic electroluminescent layer 18 can be reliably reflected towards the upper electrode 22 side. Further, the influence of light emission by the organic electroluminescent elements on the characteristics of the thin film transistor can be suppressed. At each pixel P, the upper electrode 22 is electrically connected to the stripe-shaped reflective layer 12 via the contact hole 58.

The reflective layer 12 is formed in the shape of stripes in the present second modified example as well. Accordingly, as described above, parasitic capacity formed between the reflective layer 12 and another conductive layer can be reduced as compared with the case in which the reflective layer 12 is formed over the entire surface of the display area.

THIRD MODIFIED EXAMPLE

Figure 9:
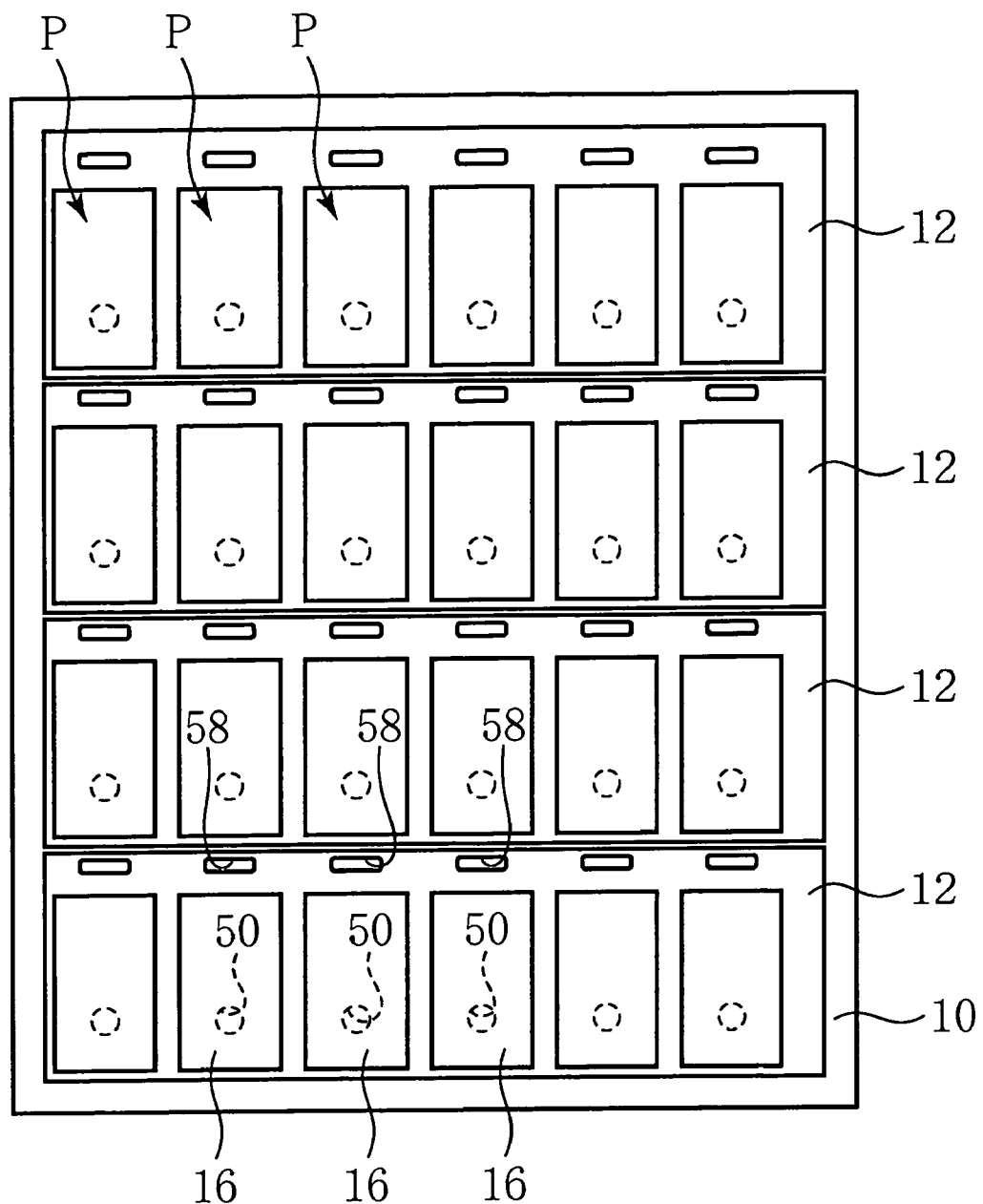
FIG. 9 is a plane view showing the structure of an organic electroluminescent display device according to a third modified example of the first embodiment of the present invention.

An organic electroluminescent display device according to a third modified example of the present first embodiment will be described with reference to FIG. 9. FIG. 9 is a plane view showing the structure of the organic electroluminescent display device according to the present third modified example.

As shown in FIG. 9, the reflective layer 12 is formed in the shape of stripes each of which extends along an array of the rectangular lower electrodes 16 arranged in a transverse direction of the figure. Each stripe of the reflective layer 12 is wider than the total width of the array of the lower electrodes 16. For this reason, light generated at the luminescent layer of the organic electroluminescent layer 18 can be reliably reflected towards the upper electrode 22 side. Further, the influence of light emission by the organic electroluminescent elements on the characteristics of the thin film transistor can be suppressed. At each pixel P, the upper electrode 22 is electrically connected to the stripe-shaped reflective layer 12 via the contact hole 58.

The reflective layer 12 is formed in the shape of stripes in the present third modified example as well. Accordingly, as described above, parasitic capacity formed between the reflective layer 12 and another conductive layer can be reduced as compared with the case in which the reflective layer 12 is formed over the entire surface of the display area.

FOURTH MODIFIED EXAMPLE

Figure 10:
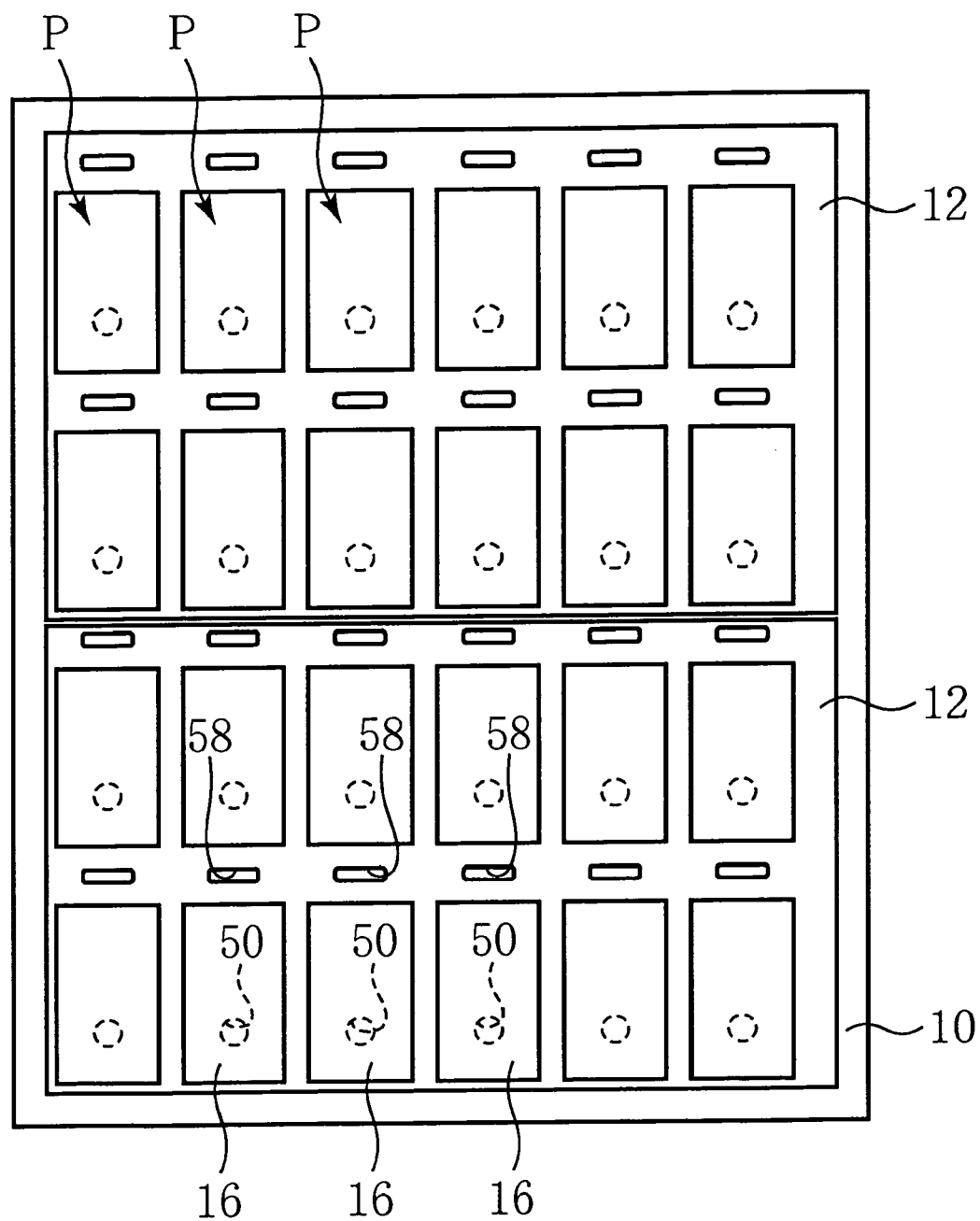
FIG. 10 is a plane view showing the structure of an organic electroluminescent display device according to a fourth modified example of the first embodiment of the present invention.

An organic electroluminescent display device according to a fourth modified example of the present first embodiment will be described with reference to FIG. 10. FIG. 10 is a plane view showing the structure of the organic electroluminescent display device according to the present fourth modified example.

As shown in FIG. 10, the reflective layer 12 is formed in the shape of stripes each of which extends along plural arrays of the rectangular lower electrodes 16 arranged in a transverse direction of the figure. Each of the stripes of the reflective layer 12 is wider than the total width of the plural arrays of the lower electrodes 16. FIG. 10 shows a case in which each stripe of the reflective layer 12 extends along two arrays of the lower electrodes 16 arranged in the transverse direction of the figure. Since each stripe of the reflective layer 12 is wider than the total width of the arrays of the lower electrodes 16, light generated at the luminescent layer of the organic electroluminescent layer 18 can be reliably reflected towards the upper electrode 22 side. Further, the influence of light emission by the organic electroluminescent elements on the characteristics of the thin film transistor can be suppressed. At each pixel P, the upper electrode 22 is electrically connected to the stripe-shaped reflective layer 12 via the contact hole 58.

The reflective layer 12 is formed in the shape of stripes in the present fourth modified example as well. Accordingly, as described above, parasitic capacity formed between the reflective layer 12 and another conductive layer can be reduced as compared with the case in which the reflective layer 12 is formed over the entire surface of the display area.

Second Embodiment

Figure 11A:
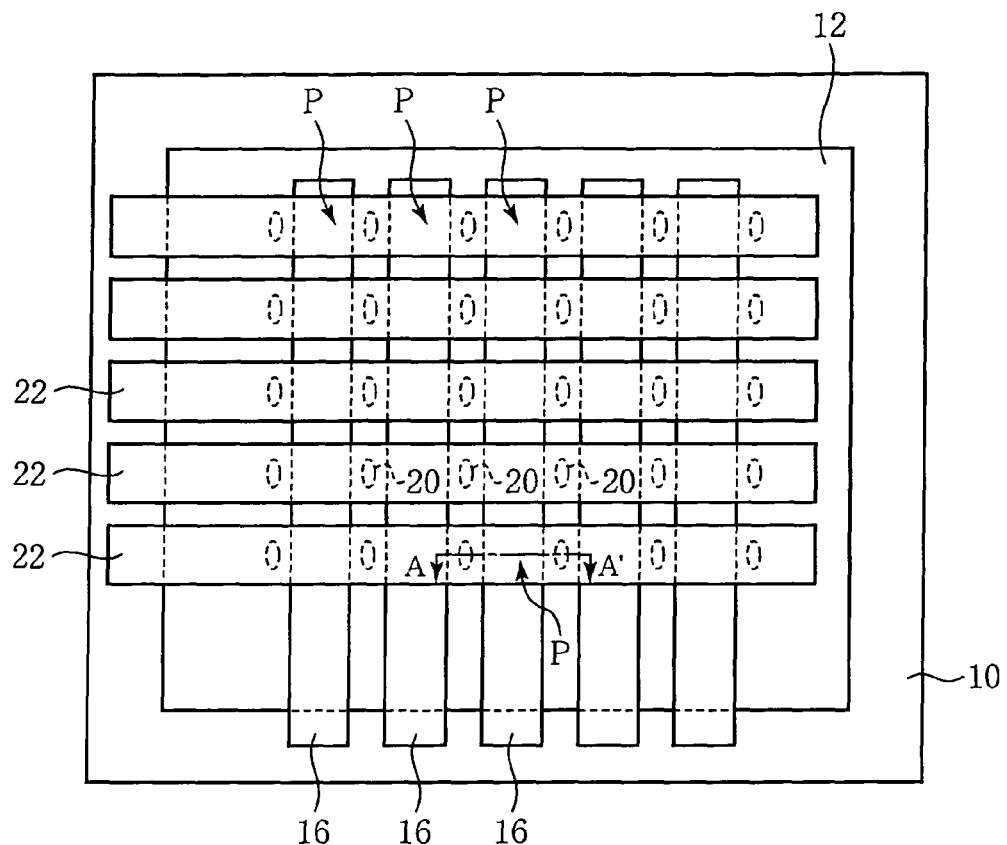
FIGS. 11A and 11B are schematic diagrams showing the structure of an organic electroluminescent display device according to a second embodiment of the present invention.
Figure 11B:
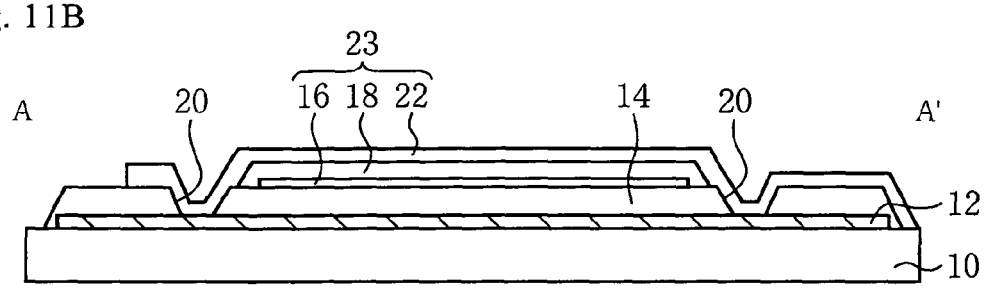

An organic electroluminescent display device and a process for manufacturing the same according to a second embodiment of the present invention will be described with reference to FIGS. 11A to 13C. FIGS. 11A and 11B are schematic diagrams showing the structure of the organic electroluminescent display device according to the present second embodiment, and FIGS. 12A to 13C are cross-sectional views showing the process for manufacturing the organic electroluminescent display device according to the present second embodiment. Components of the organic electroluminescent display device and the process for manufacturing the same of the present second embodiment which are similar to those of the organic electroluminescent display device and the process for manufacturing the same of the first embodiment are designated by the same reference characters, and detailed description thereof will be omitted or simplified.

First, the structure of the organic electroluminescent display device according to the present second embodiment will be described with reference to FIGS. 11A and 11B. FIG. 11A is a plane view showing the structure of the organic electroluminescent display device according to the present second embodiment, and FIG. 11B is an enlarged cross-sectional view thereof along line A-A'.

The main characteristic of the organic electroluminescent display device according to the present second embodiment is that the thin film transistor serving as the switching element for driving the organic electroluminescent layer is not provided for each pixel. Namely, the organic electroluminescent display device according to the present second embodiment is a passive matrix organic electroluminescent display device.

As shown in FIGS. 11A and 11B, the reflective layer which reflects light and has good conductivity is formed on the insulating substrate 10 such as a glass substrate. As shown in FIG. 11A, the reflective layer 12 is formed over the entire surface of a display area in which plural pixels P are arranged. Alternatively, the reflective layer 12 of a predetermined shape may be formed for each pixel P. An Al layer, for example, is used as the reflective layer 12. The light reflectance at the reflective layer 12 is, for example, 50% or more, and preferably 80% or more. The reflective layer 12 having such a high light reflectance is formed so as to achieve high brightness. As will be described later, the reflective layer 12 is electrically connected to the upper electrode 22 and also serves as an auxiliary electrode which decreases the resistance of the upper electrode 22.

An interlayer insulating layer 14 which transmits light is formed on the reflective layer 12. Photosensitive resin such as acrylic resin is used as a material for the interlayer insulating layer 14. The thickness of the interlayer insulating layer 14 is, for example, 1 μm or more. The interlayer insulating layer 14 which is relatively thick is formed so as to prevent light from decreasing due to interference of light. The light transmittance of the interlayer insulating layer 14 is, for example, 50% or more, and preferably 80% or more. The interlayer insulating layer 14 having such a high light transmittance is formed so as to achieve high brightness.

The lower electrode 16 is formed on the interlayer insulating layer 14. As shown in FIG. 11A, the lower electrode 16 is formed in the shape of stripes extending in a predetermined direction (longitudinal direction of FIG. 11A). A transparent conductive layer made of, for example, ITO, is used as the lower electrode 16. The lower electrode 16 serves as an anode.

The organic electroluminescent layer 18 in which the hole injection layer, the hole transport layer, the luminescent layer, an electron transport layer and an electron injection layer are sequentially laminated is formed on the lower electrode 16. The organic electroluminescent layer 18 is formed in the shape of a rectangle which is wider than the stripe-shaped lower electrode 16. A 2-TNATA layer, for example, is used as the hole injection layer. An α-NPD layer, for example, is used as the hole transport layer. An $Alq_3$ layer in which, for example, a small amount of t(npa)py(1,3,6,8-tetra(N-naphthyl-N'-phenylamino)pyrene) is doped is used as the luminescent layer. An $Alq_3$ layer, for example, is used as the electron transport layer. A LiF (lithium fluoride) layer, for example, is used as the electron injection layer.

A contact hole 20 reaching the reflective layer 12 is formed in the interlayer insulating layer 14 at the sides of the lower electrode 16 on which the organic electroluminescent layer 18 is formed.

The upper electrode 22 which transmits light is formed on the interlayer insulating layer 14 and organic electroluminescent layer 18 having the contact holes 20 formed therein. As shown in FIG. 11A, the upper electrode 22 is formed in the shape of stripes extending in a direction orthogonal to the lower electrode 16 (transverse direction of FIG. 11A). The upper electrode 22 is electrically connected to the reflective layer 12 via the contact holes 20. The reflective layer 12 having the upper electrode 22 connected thereto is formed of a material having a resistance lower than that of the upper electrode 22. For example, a laminated layer formed by sequentially laminating an Al layer, which has a thickness of 30 nm or less and transmits light, and a transparent conductive layer made of ITO is used as the upper electrode 22. The light transmittance of the upper electrode 22 is, for example, 50% or more, and preferably 80% or more. The upper electrode 22 serves as a cathode electrode.

In this way, the organic electroluminescent element 23 having the lower electrode 16, the organic electroluminescent layer 18 and the upper electrode 22 is formed on the interlayer insulating layer 14.

The above organic electroluminescent element 23 is formed at each region at which the lower electrode 16 and the upper electrode 22 cross each other, and, as shown in FIG. 11A, the pixel P is formed at each region at which the lower electrode 16 and the upper electrode 22 cross each other. For each pixel P, the contact hole 20 is formed and the upper electrode 22 is electrically connected via the contact hole 20 to the reflective layer 12.

In this way, the organic electroluminescent display device according to the present second embodiment is formed.

In the organic electroluminescent display device of the present second embodiment, an electron is injected from the upper electrode 22 into the organic electroluminescent layer 18, and a hole is injected from the lower electrode 16 into the organic electroluminescent layer 18. The electron injected is transported to the luminescent layer by the electron transport layer, and the hole injected is transported to the luminescent layer by the hole transport layer. Light is generated when the electron and hole thus transported recombine at the luminescent layer. The light generated at the luminescent layer is emitted towards the upper electrode 22 and the lower electrode 16. The light emitted towards the light-transmitting upper electrode 22 directly exits therefrom. The light emitted towards the lower electrode 16 proceeds via the lower electrode 16, which is formed by a transparent conductive layer, and the light-transmitting interlayer insulating layer 14, but is reflected by the reflective layer 12 towards the light-transmitting upper electrode 22, and exits therefrom.

As described above, the organic electroluminescent display device of the present second embodiment has a top emission structure in which light exits from the upper electrode 22 side.

As described above, the main characteristic of the organic electroluminescent display device according to the present second embodiment is that the device is a passive matrix organic electroluminescent display device, i.e., an organic electroluminescent display device formed without a thin film transistor, which serves as a switching element for driving the organic electroluminescent layer, being provided for each pixel.

The passive matrix organic electroluminescent display device as in the present second embodiment may be formed. According to the present second embodiment, an organic electroluminescent display device of high brightness can be provided even by the passive matrix organic electroluminescent display device in which light is made to exit from the upper electrode 22 side.

Next, the process for manufacturing the organic electroluminescent display device according to the present second embodiment will be described with reference to FIGS. 12A to 13C.

First, for example, the Al layer 12 having a thickness of 200 nm is formed on the insulating substrate 10 such as a glass substrate by sputtering, for example.

Then, the Al layer 12 is subjected to patterning by photolithography and dry etching to be given a predetermined shape. In this way, the reflective layer 12 of Al is formed on the interlayer insulating substrate 10 (see FIG. 12A).

Subsequently, photosensitive resin which transmits light is applied by, for example, spin coating onto the insulating substrate 10 on which the reflective layer 12 is formed. Acrylic resin, for example, is used as the photosensitive resin. In this way, the interlayer insulating layer 14 made of the light-transmitting photosensitive resin is formed on the reflective layer 12 and the insulating substrate 10 (see FIG. 12B). The thickness of the interlayer insulating layer 14 formed between the lower electrode 16 and the reflective layer 12 is preferably set to be 1 μm or more. If the thickness of the interlayer insulating layer 14 to be less than 1 μm, light may decrease at the interlayer insulating layer 14 due to interference of light, thereby leading to insufficient brightness.

Thereafter, the interlayer insulating layer 14 made of photosensitive resin is exposed using a predetermined mask, and developed with a predetermined developer. In this way, the contact holes 20 reaching the reflective layer 12 are formed in the interlayer insulating layer 14 (see FIG. 12C).

Figure 12A:
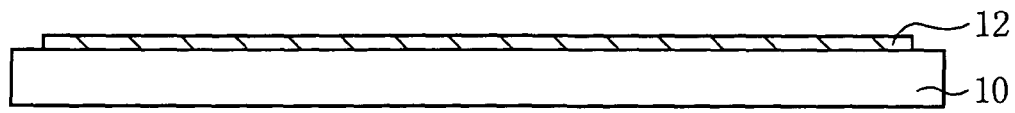
FIGS. 12A to 13C are cross-sectional views showing a process for manufacturing the organic electroluminescent display device according to the second embodiment of the present invention.
Figure 12B:
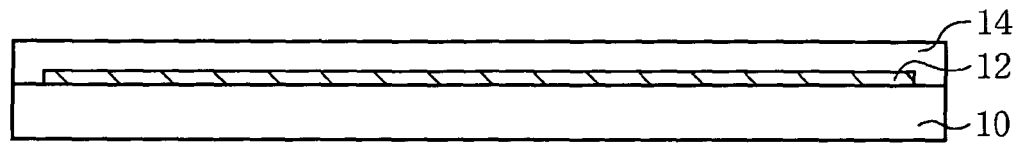
Figure 12C:
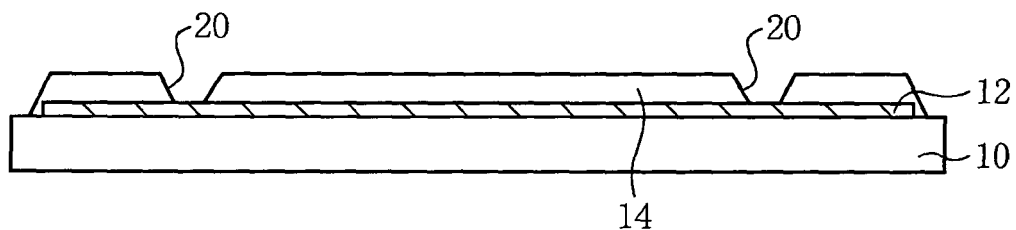
Figure 12D:
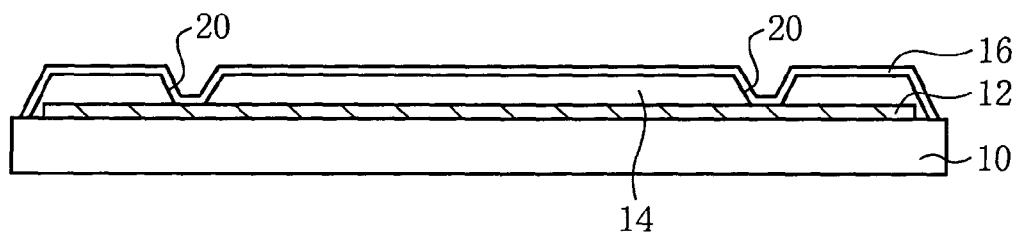
Figure 13A:
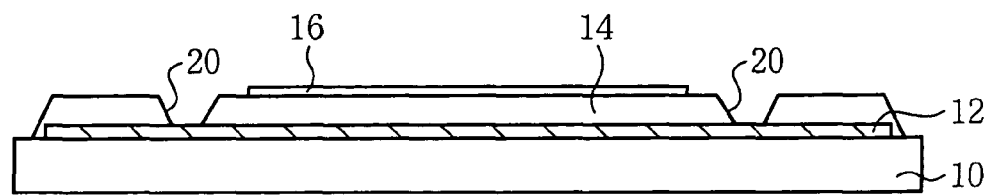
Figure 13B:
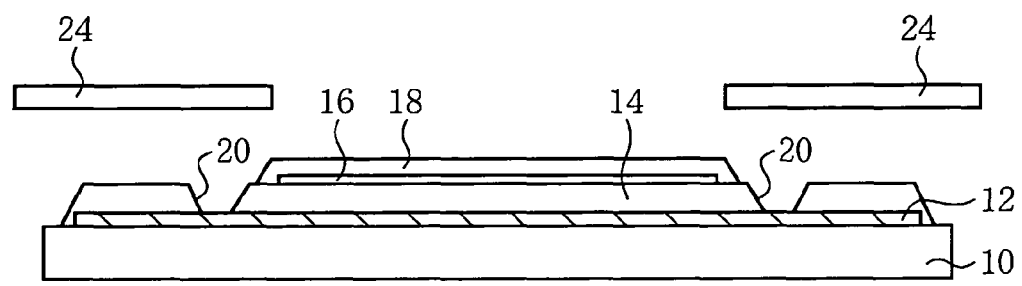
Figure 13C:
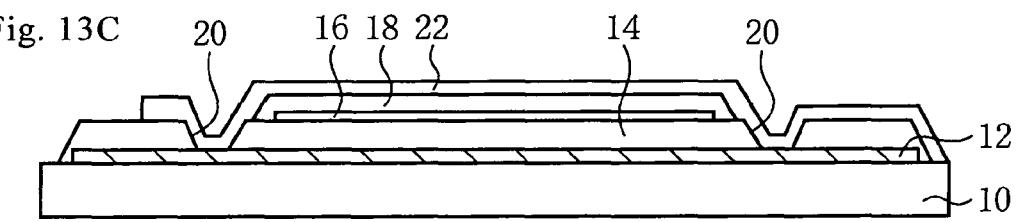

Then, the transparent conductive layer 16 which is, for example, an ITO layer having a thickness of 20 nm is formed by sputtering, for example, on the interlaying insulating layer 14 (see FIG. 12D).

Subsequently, the transparent conductive layer 16 is subjected to patterning by photolithography and etching to be formed in the shape of stripes extending in a predetermined direction. In this way, the lower electrode 16 formed by the transparent conductive layer is formed (see FIG. 13A).

Thereafter, for example, a 2-TNATA layer having a thickness of 20 nm, an α-NPD layer having a thickness of 20 nm, an Alq$_3$ layer having a thickness of 20 nm and in which a small amount of t(npa)py is doped, an Alq$_3$ layer having a thickness of 20 nm and a LiF layer having a thickness of 0.5 nm are sequentially formed on the lower electrode 16 by the vacuum evaporation method via the evaporation mask 24 which has an opening of a predetermined size. In this way, the organic electroluminescent layer 18 having the 2-TNATA hole injection layer, the α-NPD hole transport layer, the t(npa)py-doped Alq$_3$ luminescent layer, the Alq$_3$ electron transport layer and the LiF electron injection layer is formed on the lower electrode 16 (see FIG. 13B).

Subsequently, on the interlayer insulating layer 14 on which the organic electroluminescent layer 18 is formed, for example, an Al layer which transmits light and has a thickness of 10 nm, and a transparent conductive layer which is, for example, an ITO layer having a thickness of 30 nm, are sequentially formed by the vacuum evaporation method or sputtering, for example, via a mask which has an opening of a predetermined shape. In this way, the stripe-shaped upper electrode 22 extending in the direction orthogonal to the lower electrode 16 is formed (see FIG. 13C). The upper electrode 22 is electrically connected to the reflective layer 12 via the contact hole 20.

The organic electroluminescent display device according to the present second embodiment shown in FIGS. 11A and 11B is manufactured as described above.

As described above, according to the present second embodiment, the reflective layer 12 is formed below the lower electrode 16, and the upper electrode 22 is electrically connected to the reflective layer 12 via the contact holes 20. Thus, the resistance of the upper electrode 22 can be decreased while decrease in the aperture ratio of the pixel is avoided, whereby voltage drop of the upper electrode 22 can be suppressed. As a result, the top emission organic electroluminescent display device of good display properties and high brightness can be provided.

In the above description, the reflective layer 12 is formed over the entire surface of the display area in which the plural pixels P are arranged. However, the reflective layer 12 may be formed in the shape of stripes as in an organic electroluminescent display device according to the following modified example. By forming stripes of the reflective layer, parasitic capacity formed between the reflective layer 12 and another conductive layer can be reduced as compared with the case in which the reflective layer 12 is formed over the entire surface of the display area in which the plural pixels P are arranged.

FIRST MODIFIED EXAMPLE

Figure 14:
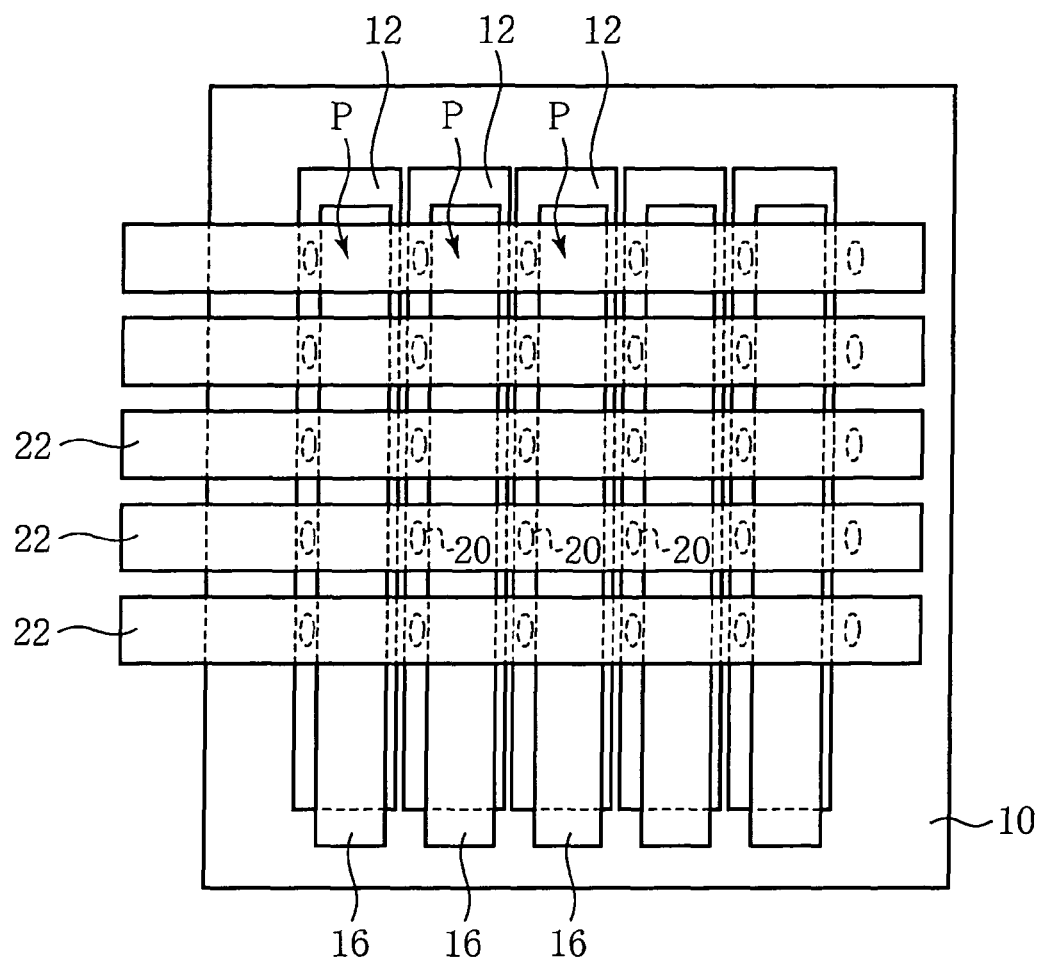
FIG. 14 is a plane view showing the structure of an organic electroluminescent display device according to a first modified example of the second embodiment of the present invention.

The organic electroluminescent display device according to a first modified example of the present second embodiment will be described with reference to FIG. 14. FIG. 14 is a plane view showing the structure of the organic electroluminescent display device according to the present first modified example.

As shown in FIG. 14, the reflective layer 12 is formed in the shape of stripes each of which extends along one of the lower electrodes 16 which are also stripe-shaped and extend in a longitudinal direction of the figure. Each stripe of the reflective layer 12 is wider than the lower electrode 16. For this reason, light generated at the luminescent layer of the organic electroluminescent layer 18 can be reliably reflected towards the upper electrode 22 side. At each pixel P, the upper electrode 22 is electrically connected to the stripe-shaped reflective layer 12 via the contact hole 20.

According to the present first modified example, the reflective layer 12 is formed in the shape of stripes. Accordingly, as described above, parasitic capacity formed between the reflective layer 12 and another conductive layer can be reduced as compared with the case in which the reflective layer 12 is formed over the entire surface of the display area.

SECOND MODIFIED EXAMPLE

Figure 15:
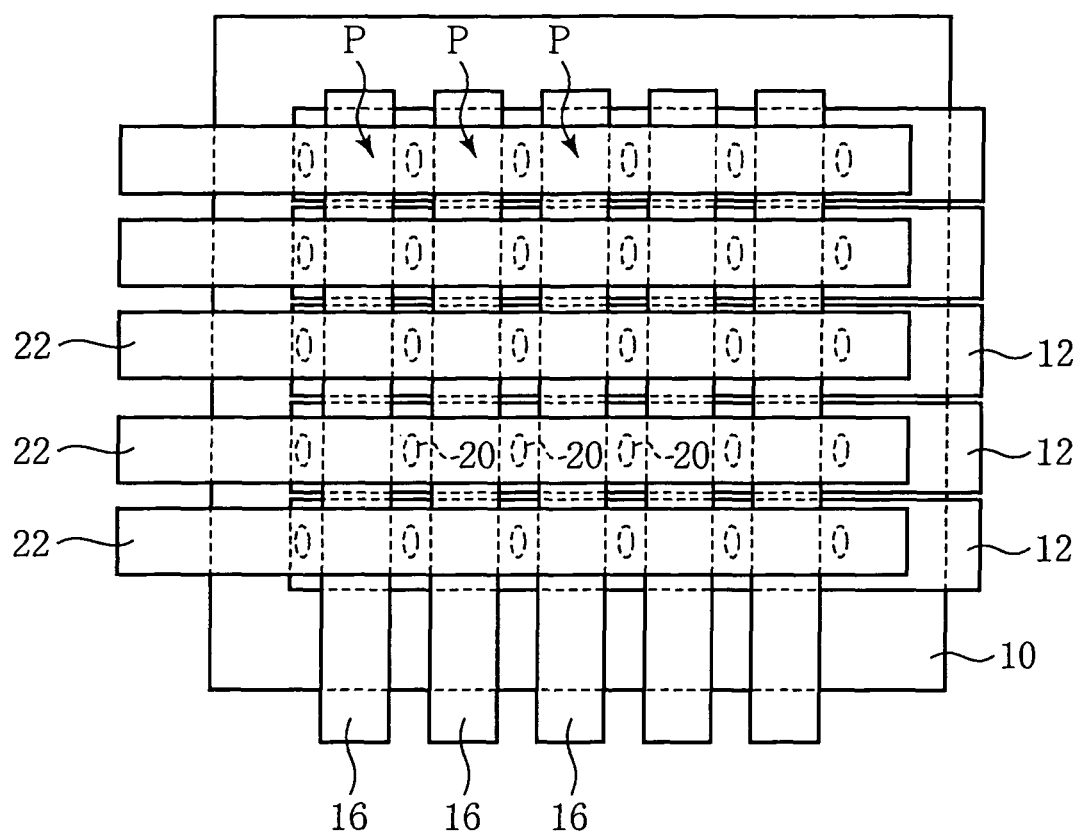
FIG. 15 is a plane view showing the structure of an organic electroluminescent display device according to a second modified example of the second embodiment of the present invention.

An organic electroluminescent display device according to a second modified example of the present second embodiment will be described with reference to FIG. 15. FIG. 15 is a plane view showing the structure of the organic electroluminescent display device according to the present second modified example.

As shown in FIG. 15, the reflective layer 12 is formed in the shape of stripes each of which extends along one of the upper electrodes 22 which are also stripe-shaped and extend in a transverse direction of the figure. Each stripe of the reflective layer 12 is wider than the upper electrode 22. For this reason, light generated at the luminescent layer of the organic electroluminescent layer 18 can be reliably reflected towards the upper electrode 22 side. At each pixel P, the upper electrode 22 is electrically connected to the stripe-shaped reflective layer 12 via the contact hole 20.

The reflective layer 12 is formed in the shape of stripes in the present second modified example as well. Accordingly, as described above, parasitic capacity formed between the reflective layer 12 and another conductive layer can be reduced as compared with the case in which the reflective layer 12 is formed over the entire surface of the display area.

Modified Embodiment

The present invention is not limited to the above embodiments, and various modifications are possible.

For example, the case in which a glass substrate is used as the insulating substrate 10 is described in the above embodiments. However, the insulating substrate 10 is not limited to the glass substrate. For example, a film of resin such as polycarbonate or polyethylene terephthalate may be used as the insulating substrate 10. An organic electroluminescent display device which is flexible can be realized by using the resin film as the insulating substrate 10. Further, a substrate which does not transmit light may be used as the substrate 10 since light is made to exit upwards above the substrate 10.

Moreover, the case in which the Al layer is used as the reflective layer 12 to reflect light generated at the luminescent layer of the organic electroluminescent layer 18 towards the upper electrode 22 is described in the above embodiments. However, the reflective layer 12 is not limited to the Al layer. A conductive layer which reflects light and is made of Al or an alloy consisting mainly of Al, or made of, for example, Ag, Au, Si, Nd, Ti, W, Cu, Ta, Nb or C, or an alloy consisting mainly of any of these can be used as the reflective layer 12.

Further, in the above embodiments, the case in which the reflective layer 12 is formed over the entire surface of the display area in which the plural pixels P are arranged, and the case in which the reflective layer 12 is formed in the shape of stripes are described. However, the reflective layer 12 is not limited to these shapes and may have various shapes.

Still further, while the case in which the ITO layer is used as the lower electrode 16 is described in the above embodiments, the lower electrode 16 is not limited to the ITO layer.

Besides the ITO layer, for example, a light-transmitting conductive layer such as an IZO (indium zinc oxide) layer or a ZnO (zinc oxide) layer may be used as the lower electrode 16.

Moreover, while the case in which the laminated layer formed by sequentially laminating the Al layer and the ITO layer is used as the upper electrode 22 is described in the above embodiments, the upper electrode 22 is not limited to the same. Besides the laminated layer formed by the Al layer and the ITO layer, a light-transmitting layer such as an ITO layer, an IZO layer, a ZnO layer, an Al layer, an Ag layer or a laminated layer formed by these layers can be used as the upper electrode 22. When the Al layer, the Ag layer, or the like is used as the upper electrode 22, the layer needs to be thin so as to transmit light.

Further, in the first embodiment, the case is described in which the 2-THATA hole injection layer, the α-NPD hole transport layer and the $Alq_3$ luminescent layer are sequentially laminated to form the organic electroluminescent layer 18, while, in the second embodiment, the case is described in which the 2-THATA hole injection layer, the α-NPD hole transport layer, the t(npa)py-doped $Alq_3$ luminescent layer, the $Alq_3$ electron transport layer and the LiF electron injection layer are sequentially laminated to form the organic electroluminescent layer 18. However, the structure and materials for the organic electroluminescent layer 18 are not limited to these. As the structure for the organic electroluminescent layer 18, a single-layer structure formed solely by the luminescent layer, a two-layer structure formed by a pair of the hole transport layer and the luminescent layer or a pair of the luminescent layer and the electron transport layer, a three-layer structure formed by the hole transport layer, the luminescent layer and the electron transport layer or the like may be used. Any organic electroluminescent materials can be used as the materials for the hole injection layer, the hole transport layer, the luminescent layer, the electron transport layer and the electron injection layer which form the organic electroluminescent layer 18.

Moreover, while the case in which the layer made of photosensitive resin is used as the interlayer insulating layers 14 and 54 is described in the above embodiments, the interlayer insulating layers 14 and 54 are not limited to the photosensitive resin layers as long as they transmit light. Besides the photosensitive resin layer, an inorganic insulating layer which transmits light, such as a silicon dioxide layer, a silicon nitride layer or a silicon nitride dioxide layer can be used as the interlayer insulating layers 14 and 54. Further, the interlayer insulating layers 14 and 54 do not need to be colorless as long as they transmit light, and layers formed of colored resin such as polyimide can be used as the interlayer insulating layers 14 and 54.

Furthermore, while the case is described in which the top-gate thin film transistor is used as the thin film transistor in the above embodiments, a bottom-gate thin film transistor may be used.

Moreover, while the case in which the polysilicon layer is used as the channel layer 28 is described in the above embodiments, an amorphous silicon layer may be used as the channel layer 28.

Further, while the case in which the thin film transistor is used as the switching element is described in the above embodiments, other switching elements may be used. For example, a switching element having a MIM (metal-insulating layer-metal) structure and using a diode, which is a two-terminal element, may be used.

According to the present invention, the reflective layer is formed below the lower electrode, and the upper electrode is electrically connected to the reflective layer. Thus, the resistance of the upper electrode can be decreased while decrease in the aperture ratio of a pixel is avoided, whereby voltage drop of the upper electrode can be suppressed. Therefore, an organic electroluminescent display device having good display properties and high brightness can be provided.

In the drawings, elements having similar functions are represented by the same reference character.

The followings are exemplary embodiments of the present invention.

<1>. An organic electroluminescent display device comprising: a substrate; a reflective layer provided on the substrate and reflecting light; an insulating layer provided on the reflective layer and transmitting light; a lower electrode provided on the insulating layer; an organic electroluminescent layer provided on the lower electrode; and an upper electrode provided on the organic electroluminescent layer and electrically connected to the reflective layer.

<2> The organic electroluminescent display device of <1>, further comprising a switching element provided on the substrate and electrically connected to the lower electrode.

<3> The organic electroluminescent display device of <1>, wherein the reflective layer comprises a material having a resistance no greater than that of the upper electrode.

<4> The organic electroluminescent display device of <1>, wherein the upper electrode is electrically connected to the reflective layer via a contact hole provided in the insulating layer.

<5> The organic electroluminescent display device of <1>, wherein the reflective layer is formed in the shape of stripes.

<6> The organic electroluminescent display device of <1>, wherein the light reflectance of the reflective layer is no less than 50%.

<7> The organic electroluminescent display device of <1>, wherein the lower electrode comprises a conductive layer which transmits light.

<8> The organic electroluminescent display device of <1>, wherein the upper electrode comprises a conductive layer which transmits light.

<9> The organic electroluminescent display device of <1>, wherein plural pixels having the lower electrode, the organic electroluminescent layer and the upper electrode are provided on the substrate, and the upper electrode is electrically connected to the reflective layer at each pixel.

<10> The organic electroluminescent display device of <1>, wherein the light transmission of the insulating layer is no less than 50%.

<11> The organic electroluminescent display device of <1>, wherein the reflective layer comprises Al, Ag, Au, Si, Nd, Ti, W, Cu, Ta, Nb, C, or an alloy including any one of Al, Ag, Au, Si, Nd, Ti, W, Cu, Ta, Nb, and C as the main component.

<12> The organic electroluminescent display device of <7>, wherein the lower electrode is an ITO layer, an IZO layer, or a ZnO layer.

<13> The organic electroluminescent display device of <8>, wherein the upper electrode is an ITO layer, an IZO layer, or a ZnO layer.

<14> The organic electroluminescent display device of <1>, wherein the thickness of the insulating layer is no less than 1 μm.

All publications, patent applications, and technical standards mentioned in this specification are herein incorporated by reference to the same extent as if each individual publication, patent application, or technical standard was specifically and individually indicated to be incorporated by reference.

What is claimed is:

1. An organic electroluminescent display device comprising:
   a substrate;
   a switching element provided on the substrate;
   a first insulating layer provided on the switching element;
   a reflective layer provided on the first insulating layer, which reflects light;
   a second insulating layer provided on the reflective layer, which transmits light;
   a lower electrode provided on the second insulating layer;
   an organic electroluminescent layer provided on the lower electrode; and
   an upper electrode provided on the organic electroluminescent layer,
   wherein the lower electrode is electrically connected to the switching element via a first contact hole provided in the first insulating layer,
   wherein the upper electrode is electrically connected to the reflective layer via a second contact hole provided in the second insulating layer, and
   wherein the second insulating layer has a thickness of 1 μm or more.

2. The organic electroluminescent display device of claim 1, wherein the reflective layer comprises a material having a resistance no greater than that of the upper electrode.

3. The organic electroluminescent display device of claim 1, wherein the reflective layer is formed in the shape of stripes.

4. The organic electroluminescent display device of claim 1, wherein the light reflectance of the reflective layer is no less than 50%.

5. The organic electroluminescent display device of claim 1, wherein the lower electrode comprises a conductive layer which transmits light.

6. The organic electroluminescent display device of claim 1, wherein the upper electrode comprises a conductive layer which transmits light.

7. The organic electroluminescent display device of claim 1, wherein plural pixels having the lower electrode, the organic electroluminescent layer and the upper electrode are provided on the substrate, and the upper electrode is electrically connected to the reflective layer at each pixel.

8. The organic electroluminescent display device of claim 1, wherein the light transmission of the second insulating layer is no less than 50%.

9. The organic electroluminescent display device of claim 1, wherein the reflective layer comprises Al, Ag, Au, Si, Nd, Ti, W, Cu, Ta, Nb, C, or an alloy including any one of Al, Ag, Au, Si, Nd, Ti, W, Cu, Ta, Nb, and C as a main component.

10. The organic electroluminescent display device of claim 5, wherein the lower electrode is an ITO layer, an IZO layer, or a ZnO layer.

11. The organic electroluminescent display device of claim 6, wherein the upper electrode is an ITO layer, an IZO layer, or a ZnO layer.

12. The organic electroluminescent display device of claim 1, wherein the second insulating layer comprises a photosensitive resin.

* * * * *